US012777720B2

(12) United States Patent
Lin et al.

(10) Patent No.: US 12,777,720 B2
(45) Date of Patent: Oct. 27, 2026

(54) ARRAY SUBSTRATE WITH COMMUNICATED VIAS, METHOD FOR MANUFACTURING SAME, AND DISPLAY PANEL

(71) Applicants: Fuzhou BOE Optoelectronics Technology Co., Ltd., Fuzhou (CN); BOE Technology Group Co., Ltd., Beijing (CN)

(72) Inventors: Bin Lin, Beijing (CN); Yang Wang, Beijing (CN); Jinliang Wang, Beijing (CN); Qiming Li, Beijing (CN); Zhenyou Zou, Beijing (CN); Zengrong Li, Beijing (CN)

(73) Assignees: FUZHOU BCE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 590 days.

(21) Appl. No.: 18/275,505

(22) PCT Filed: Jun. 30, 2022

(86) PCT No.: PCT/CN2022/103104
§ 371 (c)(1),
(2) Date: Aug. 2, 2023

(87) PCT Pub. No.: WO2024/000504
PCT Pub. Date: Jan. 4, 2024

(65) Prior Publication Data
US 2025/0015091 A1 Jan. 9, 2025

(51) Int. Cl.
*H10D 86/60* (2025.01)
*G02F 1/1362* (2006.01)
*H10D 86/40* (2025.01)

(52) U.S. Cl.
CPC ....... *H10D 86/60* (2025.01); *G02F 1/136295* (2021.01); *H10D 86/441* (2025.01)

(58) Field of Classification Search
CPC . H10D 86/60; H10D 86/441; G02F 1/136295
See application file for complete search history.

(56) References Cited

U.S. PATENT DOCUMENTS 6,127,271 A 10/2000 Turlot et al.
9,711,549 B2 * 7/2017 Yamazaki .............. H10F 39/18
(Continued)

FOREIGN PATENT DOCUMENTS

CN 103354206 A 10/2013
CN 104299942 A 1/2015
(Continued)

*Primary Examiner* — Caleb E Henry
(74) *Attorney, Agent, or Firm* — XSENSUS LLP

(57) ABSTRACT

Provided is an array substrate. The array substrate includes: a substrate, and a first electrode, a connecting electrode, and at least two insulating layers arranged on the substrate, wherein the first electrode is disposed on a side, proximal to the first electrode, of the at least two insulating layers, and the connecting electrode is disposed on a side, facing away from the substrate, of the at least two insulating layers; and at least two communicated vias are arranged in the at least two insulating layers, a size of a first via, most proximal to the substrate, in the at least two vias is less than sizes of other vias, and the connecting electrode is lapped with the first electrode via the at least two vias.

19 Claims, 9 Drawing Sheets

(56) References Cited

U.S. PATENT DOCUMENTS

| | | | | |
|---|---|---|---|---|
| 9,728,557 | B2 * | 8/2017 | Wang | H10D 86/441 |
| 10,545,594 | B2 * | 1/2020 | Liu | G06F 3/0412 |
| 10,790,310 | B2 * | 9/2020 | Liu | H10D 30/6723 |
| 11,335,709 | B2 * | 5/2022 | He | H10D 86/471 |
| 11,573,469 | B2 * | 2/2023 | Itou | G02F 1/136286 |
| 2003/0207585 | A1 | 11/2003 | Choi et al. | |
| 2004/0009663 | A1 | 1/2004 | Yu | |
| 2006/0170835 | A1 * | 8/2006 | Jun | G02F 1/136213 349/38 |
| 2016/0033832 | A1 * | 2/2016 | Xu | G02F 1/136213 257/71 |
| 2016/0079287 | A1 | 3/2016 | Yan et al. | |
| 2016/0247834 | A1 | 8/2016 | Li et al. | |
| 2017/0287947 | A1 * | 10/2017 | Li | H10D 86/443 |
| 2017/0307921 | A1 * | 10/2017 | Feng | G02F 1/1343 |
| 2018/0097190 | A1 | 4/2018 | Zhou et al. | |
| 2018/0138254 | A1 * | 5/2018 | Liu | H10D 30/0314 |
| 2019/0086701 | A1 * | 3/2019 | Xie | G02F 1/133553 |
| 2019/0131316 | A1 | 5/2019 | Su et al. | |
| 2020/0168683 | A1 | 5/2020 | Son et al. | |
| 2021/0124226 | A1 | 4/2021 | Cheng et al. | |
| 2021/0202603 | A1 * | 7/2021 | Wu | H10D 86/60 |
| 2022/0208927 | A1 * | 6/2022 | Yang | G09G 3/3233 |
| 2023/0178568 | A1 | 6/2023 | Huang | |

FOREIGN PATENT DOCUMENTS

| | | | |
|---|---|---|---|
| CN | 107316839 | A | 11/2017 |
| CN | 107808886 | A | 3/2018 |
| CN | 109817531 | A | 5/2019 |
| CN | 111063696 | A | 4/2020 |
| CN | 113517328 | A | 10/2021 |
| CN | 113838874 | A | 12/2021 |
| CN | 113990805 | A | 1/2022 |
| JP | 2011-204985 | A | 10/2011 |
| KR | 1999-0083571 | A | 11/1999 |

* cited by examiner

ARRAY SUBSTRATE WITH COMMUNICATED VIAS, METHOD FOR MANUFACTURING SAME, AND DISPLAY PANEL

CROSS-REFERENCE TO RELATED APPLICATIONS

This application is a U.S. national stage of international application No. PCT/CN2022/103104, filed on Jun. 30, 2022, the disclosure of which is incorporated herein by reference in its entirety.

TECHNICAL FIELD

The present disclosure relates to the field of display technologies, and in particular, relates to an array substrate, a method for manufacturing the same, and a display panel.

BACKGROUND OF THE INVENTION

With developments of display technologies, various products with display functions are present in daily life, such as mobile phones, tablet computers, televisions, notebook computers, digital photo frames, and navigators, and these products all need to be equipped with a display panel.

SUMMARY OF THE INVENTION

Embodiments of the present disclosure provide an array substrate, a method for manufacturing the same, and a display panel. The technical solutions are as follows.

In some embodiments of the present disclosure, a method for manufacturing an array substrate is provided. The method includes:

forming a first electrode on a substrate;

forming at least two insulating layers on the first electrode, and forming at least two communicated vias in the at least two insulating layers by sequentially performing a first etching treatment and a second etching treatment on the at least two insulating layers, wherein a size of a first via, most proximal to the substrate, in the at least two vias is less than sizes of other vias; and forming a connecting electrode on the at least two insulating layers, such that the connecting electrode is lapped with the first electrode via the at least two vias.

In some embodiments, forming the at least two insulating layers on the first electrode and sequentially performing the first etching treatment and the second etching treatment on the at least two insulating layers includes:

sequentially forming a first insulating layer, a second insulating layer, and a third insulating layer on the first electrode;

forming a third via in the third insulating layer by performing the first etching treatment on the third insulating layer by a first etching gas; and forming a second via in communication with the third via in the second insulating layer and a first via in communication with the second via in the first insulating layer by sequentially performing the second etching treatment on the second insulating layer and the third insulating layer by a second etching gas;

wherein an orthogonal projection of an opening, facing away from the substrate, of the second via on the substrate is within an orthogonal projection of an opening, proximal to the substrate, of the third via on the substrate, and an outer boundary of the orthogonal projection of the opening, facing away from the substrate, of the second via on the substrate is not overlapped with an outer boundary of the orthogonal projection of the opening, proximal to the substrate, of the third via on the substrate.

In some embodiments, forming the at least two insulating layers on the first electrode and sequentially performing the first etching treatment and the second etching treatment on the at least two insulating layers include:

sequentially forming a first insulating layer and a third insulating layer on the first electrode;

forming a third via in the third insulating layer by performing the first etching treatment on the third insulating layer by a first etching gas; and forming a first via in communication with the third via in the first insulating layer by performing the second etching treatment on the first insulating layer by a second etching gas;

wherein an orthogonal projection of an opening, facing away from the substrate, of the first via on the substrate is within an orthogonal projection of an opening, proximal to the substrate, of the third via on the substrate, and an outer boundary of the orthogonal projection of the opening, facing away from the substrate, of the first via on the substrate is not overlapped with an outer boundary of the orthogonal projection of the opening, proximal to the substrate, of the third via on the substrate.

In some embodiments, forming the at least two insulating layers on the first electrode and sequentially performing the first etching treatment and the second etching treatment on the at least two insulating layers include:

sequentially forming a first insulating layer, a second insulating layer, a fourth insulating layer, and a third insulating layer on the first electrode;

forming a third via in the third insulating layer by performing the first etching treatment on the third insulating layer by a first etching gas; and forming a fourth via in communication with the third via in the fourth insulating layer, a second via in communication with the fourth via in the second insulating layer, and a first via in communication with the second via in the first insulating layer by sequentially performing the second etching treatment on the fourth insulating layer, the second insulating layer, and the first insulating layer by a second etching gas;

wherein an orthogonal projection of an opening, facing away from the substrate, of the fourth via on the substrate is within an orthogonal projection of an opening, proximal to the substrate, of the third via on the substrate, and an outer boundary of the orthogonal projection of the opening, facing away from the substrate, of the fourth via on the substrate is not overlapped with an outer boundary of the orthogonal projection of the opening, proximal to the substrate, of the third via on the substrate; and an orthogonal projection of an opening, facing away from the substrate, of the second via on the substrate is within an orthogonal projection of an opening, proximal to the substrate, of the fourth via on the substrate, and an outer boundary of the orthogonal projection of the opening, facing away from the substrate, of the second via on the substrate is not overlapped with an outer boundary of the orthogonal projection of the opening, proximal to the substrate, of the fourth via on the substrate.

In some embodiments, materials of the first insulating layer and the third insulating layer both include silicon and nitrogen, and a material of the second insulating layer includes silicon and oxygen.

In some embodiments, materials of the first insulating layer and the third insulating layer include silicon and nitrogen.

In some embodiments, materials of the first insulating layer and the third insulating layer both include silicon and nitrogen, and materials of the second insulating layer and the fourth insulating layer both include silicon and oxygen.

In some embodiments, a capability of the first etching gas to laterally etch the third insulating layer is greater than a capability of the second etching gas to laterally etch the first insulating layer.

In some embodiments, the first etching gas is a mixed gas of at least one of a sulfur hexafluoride gas, a sulfur tetrafluoride gas, a carbon tetrafluoride gas, and a nitrogen fluoride gas, and an oxygen gas.

In some embodiments, the second etching gas is a mixed gas of a nitrogen trifluoride gas and an oxygen gas.

In some embodiments of the present disclosure, an array substrate is provided. The array substrate includes:

a substrate, and a first electrode, a connecting electrode, and at least two insulating layers arranged on the substrate, wherein the first electrode is disposed on a side, proximal to the first electrode, of the at least two insulating layers, and the connecting electrode is disposed on a side, facing away from the substrate, of the at least two insulating layers; and at least two communicated vias are arranged in the at least two insulating layers, a size of a first via, most proximal to the substrate, in the at least two vias is less than sizes of other vias, and the connecting electrode is lapped with the first electrode via the at least two vias.

In some embodiments, the at least two insulating layers include: a first insulating layer, a second insulating layer, and a third insulating layer sequentially arranged in a direction perpendicular to and away from the substrate, wherein the first insulating layer is provided with a first via, the second insulating layer is provided with a second via in communication with the first via, and the third insulating layer is provided with a third via in communication with the second via;

wherein an orthogonal projection of an opening, facing away from the substrate, of the second via on the substrate is within an orthogonal projection of an opening, proximal to the substrate, of the third via on the substrate, and an outer boundary of the orthogonal projection of the opening, facing away from the substrate, of the second via on the substrate is not overlapped with an outer boundary of the orthogonal projection of the opening, proximal to the substrate, of the third via on the substrate.

In some embodiments, an outer boundary of an orthogonal projection of an opening, facing away from the substrate, of the first via on the substrate is overlapped with an outer boundary of an orthogonal projection of an opening, proximal to the substrate, of the second via on the substrate.

In some embodiments, an included angle between a sidewall of the third via and a face, proximal to the substrate, of the third insulating layer is less than 60°.

In some embodiments, a distance between the outer boundary of the orthogonal projection of an opening, facing away from the substrate, of the second via on the substrate and the outer boundary of the orthogonal projection of the opening, proximal to the substrate, of the third via on the substrate ranges from 0.2 micron to 0.5 micron.

In some embodiments, a thickness of the second insulating layer ranges from 500 angstroms to 1000 angstroms, and an included angle between a sidewall of the second via and a face, proximal to the substrate, of the second insulating layer is greater than or equal to 30° and less than or equal to 50°.

In some embodiments, an included angle between a sidewall of the first via and a face, proximal to the substrate, of the first insulating layer is greater than or equal to 80° and less than 90°.

In some embodiments, the at least two insulating layers include: a first insulating layer and a third insulating layer sequentially arranged in a direction perpendicular to and away from the substrate, wherein the first insulating layer is provided with a first via, and the third insulating layer is provided with a third via in communication with the first via;

wherein an orthogonal projection of an opening, facing away from the substrate, of the first via on the substrate is within an orthogonal projection of an opening, proximal to the substrate, of the third via on the substrate, and an outer boundary of the orthogonal projection of the opening, facing away from the substrate, of the first via on the substrate is not overlapped with an outer boundary of the orthogonal projection of the opening, proximal to the substrate, of the third via on the substrate. In some embodiments, a part, proximal to the third insulating layer, of a sidewall of the first via is an arc-shaped sidewall.

In some embodiments, the at least two insulating layers include: a first insulating layer, a second insulating layer, a fourth insulating layer, and a third insulating layer sequentially arranged in a direction perpendicular to and away from the substrate, wherein the first insulating layer is provided with a first via, the second insulating layer is provided with a second via in communication with the first via, the fourth insulating layer is provided with a fourth via in communication with the second via, and the third insulating layer is provided with a third via in communication with the fourth via;

wherein an orthogonal projection of an opening, facing away from the substrate, of the fourth via on the substrate is within an orthogonal projection of an opening, proximal to the substrate, of the third via on the substrate, and an outer boundary of the orthogonal projection of the opening, facing away from the substrate, of the fourth via on the substrate is not overlapped with an outer boundary of the orthogonal projection of the opening, proximal to the substrate, of the third via on the substrate; and an orthogonal projection of an opening, facing away from the substrate, of the second via on the substrate is within an orthogonal projection of an opening, proximal to the substrate, of the fourth via on the substrate, and an outer boundary of the orthogonal projection of the opening, facing away from the substrate, of the second via on the substrate is not overlapped with an outer boundary of the orthogonal projection of the opening, proximal to the substrate of the fourth via on the substrate.

In some embodiments, the array substrate further includes: a second electrode between two adjacent insulating layers in the at least two insulating layers, the at least two insulating layers are further provided with a first lap joint via, and the connecting electrode is lapped with the second electrode via the first lap joint via.

In some embodiments, at least two communicated vias in the at least two insulating layers are configured to compose a second lap joint via, wherein a plurality of columnar compounds are provided on a sidewall of the second lap joint via, and an average height of the plurality of columnar compounds is less than a thickness of the connecting electrode.

In some embodiments of the present disclosure, a display panel is provided. The display panel includes: an array substrate and a color film substrate arranged oppositely, wherein the array substrate is the array substrate according to the above embodiments.

BRIEF DESCRIPTION OF THE DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

DETAILED DESCRIPTION OF THE INVENTION

For clearer descriptions of the objects, technical solutions, and advantages of the present disclosure, the embodiments of the present disclosure are further described in detail hereinafter with reference to the drawings.

Currently, most display panels include an array substrate, a color film substrate, and a liquid crystal layer between the array substrate and the color film substrate. The array substrate is provided with a display region and a non-display region located at a periphery of the display region. A plurality of sub-pixels are arranged in the display region, and a gate driver on array (GOA) circuit is arranged in the non-display region. In a case that the display panel needs to display screens, a plurality of sub-pixels arranged in the display region need to be controlled by the GOA circuit. The GOA circuit generally includes a plurality of thin film transistors (TFTs), and in the TFTs, a gate of at least one TFT is electrically connected to sources or drains of other TFTs. In a case that the gate of the TFT is electrically connected to the sources or drains of other TFTs, a hole needs to be punched in an insulating layer of the array substrate, and the electrical connection between the gate and the sources or drains of other TFTs is achieved by a connecting electrode.

However, the connecting electrode is prone to disconnection in a via, such that the GOA circuit on the array substrate fails to operate normally, and thus a display effect of the display panel is poor.

Figure 1:
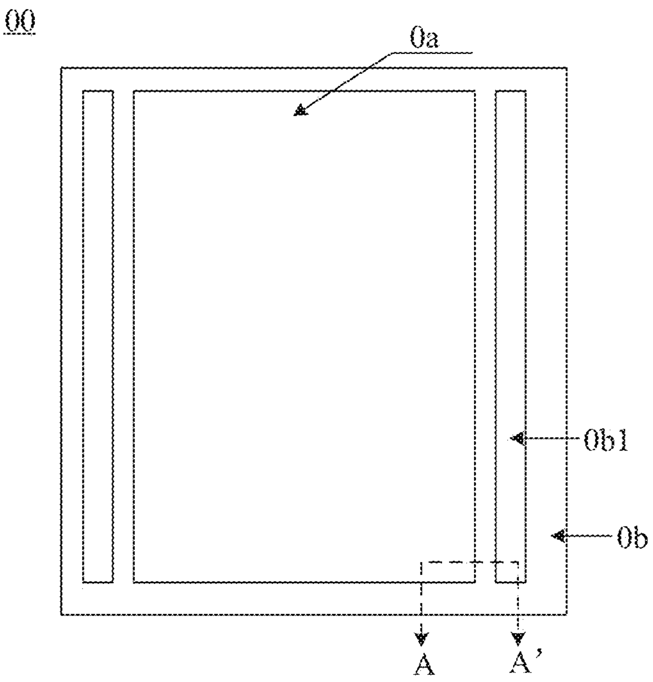
FIG. 1 is a schematic plan view of an array substrate.

Referring to FIG. 1, FIG. 1 is a schematic plan view of an array substrate. The array substrate 00 is provided with a display region 0*a*, and a non-display region 0*b* at a periphery of the display region 0*a*. A plurality of sub-pixels (not shown) are arranged in the display region 0*a*, and a GOA circuit 0*b*1 is arranged in the non-display region 0*b*. After the array substrate 00 is disposed in the display device, the array substrate 00 controls the plurality of sub-pixels arranged in the display region 0*a* through the GOA circuit 0*b*1, such that the display device displays screens.

Figure 2:
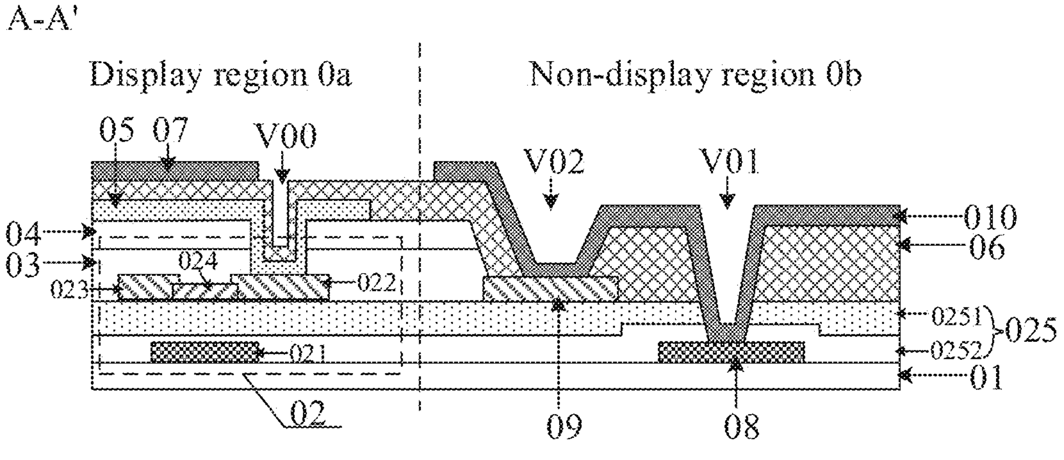
FIG. 2 is a schematic structural diagram of film layers of the array substrate as shown in FIG. 1 at A-A'.

In order to clearly see the film layer structure of the array substrate 00, referring to FIG. 2, FIG. 2 is a schematic structural diagram of film layers of the array substrate shown in FIG. 1 at A-A'. The array substrate includes: a substrate 01, and a TFT 02, a first passivation layer 03, an organic insulating layer 04, a pixel electrode 05, a second passivation layer 06, and a common electrode 07 laminated on the substrate 01.

The TFT 02 includes: a gate 021, an active layer 024, a source 023, and a drain 022. The source 023 and the drain 022 both are lapped with the active layer 024, and the active layer 024 is insulated from the gate 021 by a gate insulating layer 025. The pixel electrode 05 is electrically connected to one of the source 024 and the drain 025 in the TFT 02 via a connection via V00. The gate insulating layer 025 is provided with a first gate insulating layer 0251 and a second gate insulating layer 0252, and the first gate insulating layer 0251 is closer to the active layer 024 than the second gate insulating layer 0252. As the active layer 024 is generally made of polysilicon or an oxide semiconductor, and the active layer 024 is easily affected by ions (e.g., hydrogen ions) in the surrounding film layers, the first gate insulating layer 0251 of the gate insulating layer 025 and the first passivation layer 03 are formed by a silicon oxide material with a great insulating effect. Both the second gate insulating layer 0252 and the second passivation layer 06 are formed by a silicon nitride material.

The GOA circuit 0*b*1 in the non-display region 0*b* of the array substrate 00 generally includes a plurality of TFTs, and the TFTs are arranged in the same layer as the TFTs 02 in the display region 0*a*. As in the GOA circuit 0*b*1, a gate 08 of at least one TFT is electrically connected to sources or drains 09 of other TFTs. Therefore, holes generally need to be punched in a plurality of insulating layers of the array substrate 00, and the gate 08 of one TFT is lapped with the source or drain 09 of another TFT by the connecting electrode 010 arranged on the same layer as the common electrode 07. In this way, the GOA circuits 0*b*1 controls a plurality of sub-pixels arranged in the display region 0*a*, such that the display device normally displays the screens after the array substrate 00 is integrated in the display device. The plurality of insulating layers in the GOA circuit 0*b*1 are generally punched by one patterning process, such that a first via V01 and a second via V02 are formed in the array substrate 00. The connecting electrode 010 is lapped with the gate 08 of one TFT via the first lap joint via V01, and is lapped with the source or drain 09 of another TFT via the second via V02. It should be noted that, in forming the connection via V00 in the display region 0*a*, the first passivation layer 03 and the organic insulating layer 04 in the non-display region 0*b* are also generally removed. Therefore, in forming the first via V01, the etching treatment is performed on the first gate insulating layer 0251, the second gate insulating layer 0252, and the second passivation layer 06 simultaneously; and in forming the second via V02, the etching treatment is performed on only the second passivation layer 06. The greater the thickness of the insulating layer that needs to be etched, the more the defects in the vias formed in the insulating layer. Therefore, problems likely present in forming the first via V01 are exemplified hereinafter.

As the first gate insulating layer 0251 is formed by a silicon oxide material, and a rate of etching the silicon oxide by using an etching gas is less in a case that the silicon oxide material is punched, in forming the first via V01, a time for etching the first gate insulating layer 0251 formed by the silicon oxide material is long, and thus an efficiency of manufacturing the array substrate 00 is less.

Figure 3:
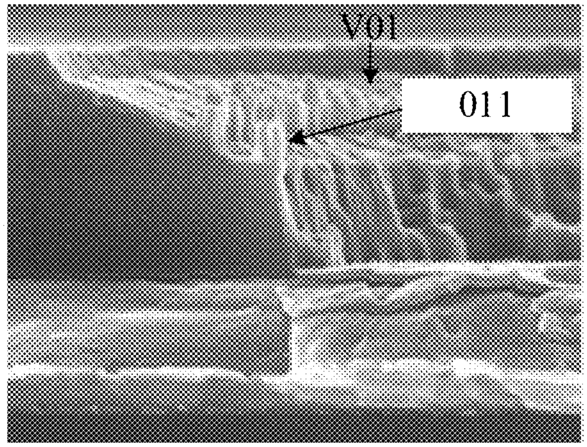
FIG. 3 is a cross-sectional scanning electron microscope image of an interior of a via upon long-time etching.

Moreover, referring to FIG. 3, FIG. 3 is a cross-sectional scanning electron microscope image of an interior of a via upon long-time etching. It may be seen from the micro-topography that, carbon-containing byproducts (e.g., $CH_2$, $CF_2$, COF, and the like) are likely generated in long-time etching and combined with Cu particles on a metal surface, and then a columnar compound 011 is formed on an inner wall of the first via V01. In this way, in a case that the connecting electrode 010 is lapped with the gate 08 of the TFT via the first via V01, the columnar compound 011 on the inner wall of the first via V01 causes the connecting electrode 010 in the first via V01 to be in poor lap joint, and thus a lap joint effect of the connecting electrode 010 with the gate 08 of the TFT is poor. Thus, the columnar compound 011 on the inner wall of the via causes the GOA circuit 0*b*1 to fail to operate, and thus the display effect of the display device is poor.

Figure 4:
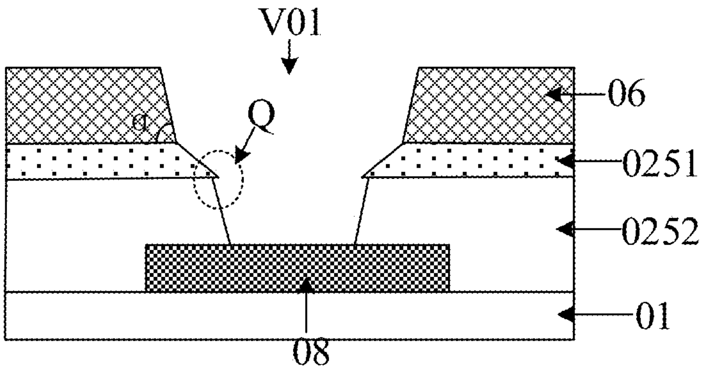
FIG. 4 is a schematic structural diagram of film layers of an insulating layer with a first via.

In addition, referring to FIG. 2 and FIG. 4, FIG. 4 is a schematic structural diagram of film layers of an insulating layer with a first via. In forming the first via V01, as the etching gas shows a great capability to longitudinally etch the second passivation layer 06 and a weak capability to laterally etch the second passivation layer 06, a gradient angle α of the second passivation layer 06 is great, for example, generally greater than 60°. In this way, disconnection is highly likely to occur in a position between a portion, outside the first via V01, of the connecting electrode 010 and a portion, inside the first via V01, of the connecting electrode 010. Meanwhile, in forming the first via V01 by etching a plurality of insulating layers by using a same etching gas, an etching rate of the second gate insulating layer 0252 formed by the silicon nitride material is greater than an etching rate of the first gate insulating layer 0251 formed by the silicon oxide material, and thus a protrusion is easily generated in a position Q, proximal to the first gate insulating layer 0251, of the second gate insulating layer 0252 in the first via V01. In this way, the connecting electrode 010 in the first via V01 is also prone to disconnection at the position Q, and thus a lap joint effect of the common electrode 07 with the gate 08 of the TFT is poor. The GOA circuit 0*b*1 fails to operate after the connecting electrode 010 has been disconnected.

Figure 5:
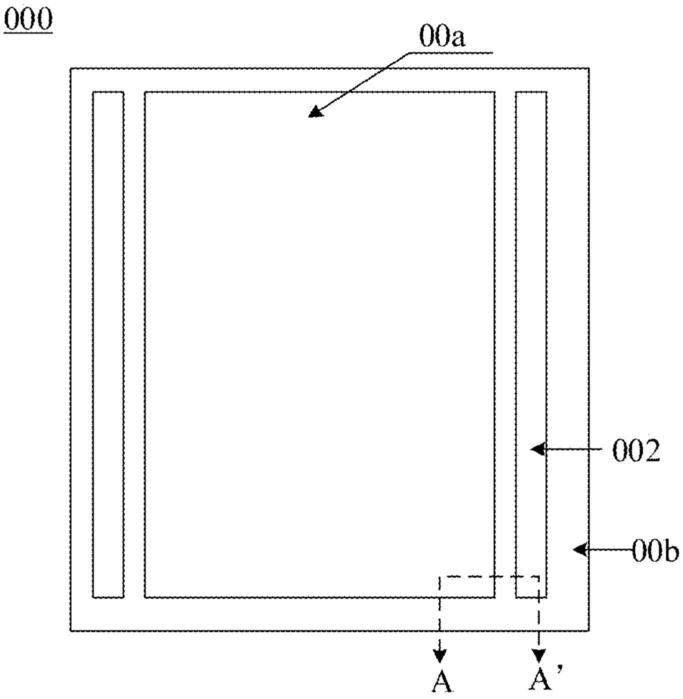
FIG. 5 is a schematic plan view of an array substrate according to some embodiments of the present disclosure.
Figure 6:
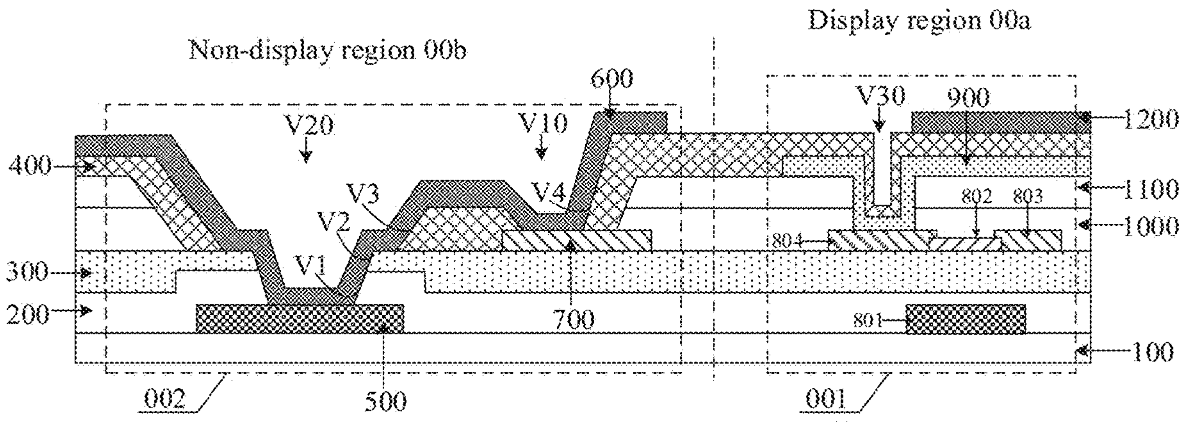
FIG. 6 is a schematic structural diagram of film layers of the array substrate as shown in FIG. 5 at A-A'.

Prior to descriptions of the structural principle of the array substrate according to some embodiments of the present disclosure, use scenarios related to the array substrate according to some embodiments of the present disclosure are illustrated firstly. Referring to FIG. 5 and FIG. 6, FIG. 5 is a top view of an array substrate according to some embodiments of the present disclosure, and FIG. 6 is a schematic structural diagram of film layers of the array substrate shown in FIG. 5 at A-A'. The array substrate 000 is provided with a display region 00*a*, and a non-display region 00*b* at a periphery of the display region 00*a*. A plurality of sub-pixels 001 arranged in an array are distributed in the display region 00*a*, and a GOA circuit 002 is distributed in the non-display region 00*b*. The GOA circuit 002 is electrically connected to gates of driver TFTs in the sub-pixels 001, such that the GOA circuit 002 drives the driver TFTs in the sub-pixels 001 to operate.

In addition, the GOA circuit 002 includes a plurality of TFTs arranged in the same layer as the driver TFTs in the sub-pixels 001. In the plurality of TFTs in the GOA circuit 002, a gate (i.e., the first electrode 500 hereinafter) of one TFT is electrically connected to one of a source and drain (i.e., a second electrode 700 hereinafter) of another TFT. As the array substrate 000 generally includes a plurality of insulating layers, in a case that the first electrode 500 needs to be lapped with the second electrode 700, a first lap joint via V10 and a second lap joint via V20 are formed in the insulating layer in the non-display region 00*b*. Illustratively, the first lap joint via V10 and the second lap joint via V20 in the array substrate 000 are generally formed by the one patterning process. Illustratively, a photoresist thin film is first coated on the array substrate 000 including the insulating layer, a photoresist pattern is acquired by exposing and developing the photoresist thin film coated on the array substrate 000 once, a part of the array substrate 000 without the photoresist pattern is etched by dry etching, and the photoresist on the array substrate 000 is removed, such that the first lap joint via V10 and the second lap joint via V20 are formed in the non-display region 00*b* of the array substrate 000.

At least a part of the first electrode 500 needs to be disposed in the second lap joint via V20, at least a part of the second electrode 700 needs to be disposed in the first lap joint via V10, and the connecting electrode 600 needs to be lapped with the first electrode 500 in the second lap joint via V20 and lapped with the second electrode 700 in the first lap joint via V10. In this way, the first electrode 500 is lapped with the second electrode 700 through the connecting electrode 600.

It should be noted that as the first electrode 500 belongs to a gate metal layer in the array substrate 000, the second electrode 700 belongs to a source-drain metal layer in the array substrate 000, the gate metal layer is closer to the substrate 100 in the array substrate 000 than the source-drain metal layer, and a conductive layer of the connecting electrode 600 is generally disposed on an outermost side of the array substrate 000. Therefore, a thickness of the insulating layer between the connecting electrode 600 and the first electrode 500 is greater than a thickness of the insulating layer between the connecting electrode 600 and the second electrode 700. That is, a depth of the second lap joint via V20 formed in the array substrate 000 is greater than a depth of the first lap joint via V10. In addition, as a larger depth of the lap joint via is prone to defects in forming, and a probability of defects occurring in the second lap joint via V20 in the array substrate 000 according to the embodiments of the present disclosure is lower, the following embodiments focus on the structural principle and the formation process of the second lap joint via V20 with a great depth for illustration.

The embodiments of the present disclosure provide an array substrate. The array substrate includes: a substrate; a first electrode, a connecting electrode, and at least two insulating layers arranged on the substrate. The first electrode is disposed on a side, proximal to the first electrode, of the at least two insulating layers, and the connecting electrode is disposed on a side, facing away from the substrate, of the at least two insulating layers.

At least two communicated vias are arranged in the at least two insulating layers, a size of a first via in at least two of the vias most proximal to the substrate is less than that of other vias, and the connecting electrode is lapped with the first electrode via the at least two vias.

At least two communicated vias in the at least two insulating layers are configured to compose a second lap joint via. As a size of the first via, most proximal to the substrate, in the at least two vias is less than sizes of other vias, and illustratively, vias with different sizes are formed in the at least two insulating layers by performing an etching treatment on the at least two insulating layers by using two etching gases, a stepped structure is formed in a second lap joint via. Thus, a part of the connecting electrode is disposed on the stepped structure. In this way, the contact area between the connecting electrode in the second lap joint via and film layers is increased, and the disconnection is less likely to occur, such that the lap joint effect of the connecting electrode and the first electrode is great. In this way, a great effect of the electrical connection between different TFTs in the GOA circuit is ensured, such that the display effect of the display device equipped with the array substrate according to the embodiments of the present disclosure is great.

In the present disclosure, the embodiments of the present disclosure are illustrated by taking the following three optional implementations as examples due to various ways of matching at least two insulating layers in the array substrate.

Figure 7:
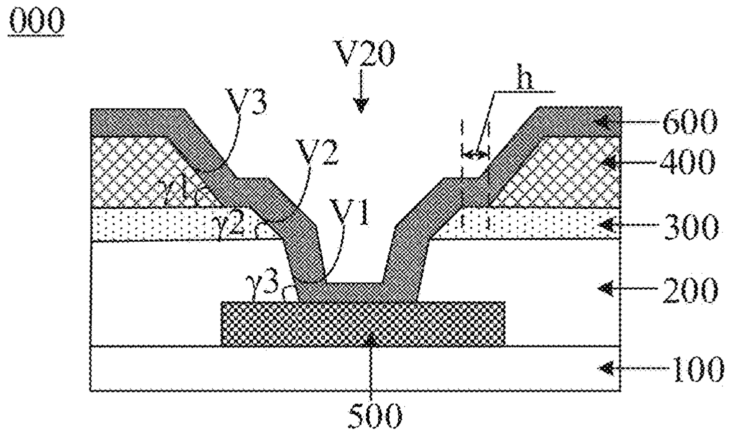
FIG. 7 is a schematic structural diagram of film layers of an array substrate according to some embodiments of the present disclosure.

In first optional implementations, referring to FIG. 7, FIG. 7 is a schematic structural diagram of film layers of an array substrate according to some embodiments of the present disclosure. The array substrate 000 includes: a substrate 100, a first insulating layer 200, a second insulating layer 300, a third insulating layer 400, a first electrode 500, and a connecting electrode 600.

The first insulating layer 200, the second insulating layer 300, and the third insulating layer 400 are sequentially laminated in a direction perpendicular to and away from the substrate 100. The first insulating layer 200 is provided with a first via V1, the second insulating layer 300 is provided with a second via V2 in communication with the first via V1, and the third insulating layer 400 is provided with a third via V3 in communication with the second via V2. The first via V1, the second via V2, and the third via V3 compose the second lap joint via V20 according to the above embodiments.

An orthogonal projection of an opening, facing away from the substrate 100, of the second via V2 on the substrate 100 is within an orthogonal projection of an opening, proximal to the substrate 100, of the third via V3 on the substrate 100, and an outer boundary of the orthogonal projection of the opening, facing away from the substrate 100, of the second via V2 on the substrate 100 is not overlapped with an outer boundary of the orthogonal projection of the opening, proximal to the substrate 100, of the third via V3 on the substrate 100. In this way, in the second lap joint via V20 composed of the first via V1, the second via V2, and the third via V3, the second insulating layer 300 protrudes from the third insulating layer 400. It should be noted that an outer boundary of an orthogonal projection of an opening on the substrate 100 according to the embodiments of the present disclosure refers to: an outline border of the orthogonal projection of the opening on the substrate 100.

The first electrode 500 is disposed on a side, proximal to the substrate 100, of the first insulating layer 200, and an orthogonal projection of the first electrode 500 on the substrate 100 is at least partially overlapped with an orthogonal projection of the first via V1 on the substrate 100. In this way, at least a part of the first electrode 500 is within the first via V1 in the first insulating layer 200. The first electrode 500 is a gate of a TFT in the GOA circuit 001 according to the above embodiments.

The connecting electrode 600 is disposed on a side, facing away from the substrate 100, of the third insulating layer 400, and at least a part of the connecting electrode 600 is within the first via V1, the second via V2, and the third via V3, and lapped with the first electrode 500.

In the embodiments of the present disclosure, as in the second lap joint via V20 composed of the first via V1, the second via V2, and the third via V3, the second insulating layer 300 protrudes from the third insulating layer 400, and a part of the second insulating layer 300 protruding from the third insulating layer 400 is a stepped structure, after at least a part of the connecting electrode 600 is within the second lap joint via V20, a part of the connecting electrode 600 is disposed on the stepped structure. In this way, the contact area between the connecting electrode 600 in the second lap joint via V20 and film layers is increased, and the disconnection is less likely to occur, such that the lap joint effect of the connecting electrode 600 with the first electrode 500 is great. Thus, a great effect of the electrical connection between different TFTs in the GOA circuit 002 is ensured, such that the display effect of the display device equipped with the array substrate according to the embodiments of the present disclosure is great.

In the present disclosure, the outer boundary of the orthogonal projection of the opening, facing away from the substrate 100, of the first via V1 in the first insulating layer 200 on the substrate 100 is overlapped with the outer boundary of the orthogonal projection of the opening, proximal to the substrate 100, of the second via V2 in the second insulating layer 300 on the substrate 100. Compared with the above description in which the unnecessary protrusion is easily generated at the position Q in the via in the array substrate, the unnecessary protrusion is not present at a contact position of the first insulating layers 200 and the second insulating layers 300 in the communicated first via V1 and second via V2 in the embodiments of the present disclosure, such that the lap joint effect of the connecting electrode 600 with the first insulating layer 200 and the second insulating layer 300 is great. Thus, the probability of the disconnection of the connecting electrode 600 in the second lap joint via V20 is further reduced.

In the embodiments of the present disclosure, an included angle γ1 between a sidewall of the third via V3 and a face, proximal to the substrate 100, of the third insulating layer 400 is less than 60°. In some embodiments, the included angle γ1 between the sidewall of the third via V3 and the face, proximal to the substrate 100, of the third insulating layer 400 is less than or equal to 45°. A thickness of the third insulating layer 400 ranges from 1000 angstroms to 4000 angstroms. Compared with the great gradient angle α of the second passivation layer 06 in the array substrate described above, the included angle γ1 between the sidewall of the third via V3 and the face, proximal to the substrate 100, of the third insulating layer 400 is less in the embodiments of the present disclosure, such that the disconnection of the connecting electrode 600 at a position inside the first via V1 and outside the first via V1 is less likely to occur. Thus, in a case that the connecting electrode 600 is lapped with the third via V3, the included angle γ1 between the sidewall of the third via V3 and the face, proximal to the substrate 100, of the third insulating layer 400 is less, such that the lap joint effect of the connecting electrode 600 with the third via V3 is great, and the display effect of the display device provided with the array substrate according to the embodiments of the present disclosure is great.

In the present disclosure, a distance h between the outer boundary of the orthogonal projection of the opening, facing away from the substrate 100, of the second via V2 in the second insulating layer 300 on the substrate 100 and the outer boundary of the orthogonal projection of the opening, proximal to the substrate 100, of the third via V3 in the third insulating layer 400 on the substrate 100 ranges from 0.2 micron to 0.5 micron. The distance h between the outer boundary of the orthogonal projection of the opening, facing away from the substrate 100, of the second via V2 in the second insulating layer 300 on the substrate 100 and the outer boundary of the orthogonal projection of the opening, proximal to the substrate 100, of the third via V3 in the third insulating layer 400 on the substrate 100 is a width of the stepped structure of the second insulating layer 300 protruding from the third insulating layer 400. In a case that the width of the stepped structure ranges from 0.2 micron to 0.5 micron, at least a part of the connecting electrode 600 is within the second lap joint via V20 and on the stepped structure, such that the probability of disconnection of the connecting electrode 600 in the second lap joint via V20 is further reduced.

In the embodiments of the present disclosure, an included angle γ2 between a sidewall of the second via V2 and a face, proximal to the substrate 100, of the second insulating layer 300 is in correlation with a thickness of the second insulating layer 300. In some embodiments of the present disclosure, the included angle γ2 is greater than or equal to 30° and less than or equal to 50°. In some embodiments, the included angle γ2 is less than or equal to 30°. Illustratively, in a case that the thickness of the second insulating layer 300 ranges from 500 angstroms to 1000 angstroms, the included angle γ2 between the sidewall of the second via V2 and the face, proximal to the substrate 100, of the second insulating layer 300 is less than or equal to 50°. Or, in a case that the thickness of the second insulating layer 300 ranges from 200 angstroms to 500 angstroms, the included angle γ2 between the sidewall of the second via V2 and the face, proximal to the substrate 100, of the second insulating layer 300 is less than or equal to 30°. In this case, the included angle γ2 between the sidewall of the second via V2 and the face, proximal to the substrate 100, of the second insulating layer 300 is in correlation with the second insulating layer 300, and the included angle γ2 between the sidewall of the second via V2 and the face, proximal to the substrate 100, of the second insulating layer 300 is ensured to be less by controlling the thickness of the second insulating layer 300. Thus, in a case that the connecting electrode 600 is lapped with the second via V2, the lap joint effect of the connecting electrode 600 with the sidewall of the second via V2 in the second insulating layer 300 is great, that is, the disconnection of the connecting electrode 600 in the second lap joint via V20 is less likely to occur. It should be noted that the smaller the included angle γ2 between the sidewall of the second via V2 in the second insulating layer 300 and the face, proximal to the substrate 100, of the second insulating layer 300, the easier for the lap joint between the connecting electrode 600 with the sidewall of the second via V2 in the second insulating layer 300, such that the disconnection of the connecting electrode 600 in the second lap joint via V20 is less likely to occur.

In the present disclosure, an included angle γ3 between a sidewall of the first via V1 in the first insulating layer 200 and a face, proximal to the substrate 100, of the first insulating layer 200 is greater than or equal to 80° and less than 90°. The included angle γ3 between the sidewall of the first via V1 in the first insulating layer 200 and the face, proximal to the substrate 100, of the first insulating layer 200 is great. However, as the included angle γ2 between the sidewall of the second via V2 in the second insulating layer 300 and the face, proximal to the substrate 100, of the second insulating layer 300 is less, and the included angle γ1 between the sidewall of the third via V3 and the face, proximal to the substrate 100, of the third insulating layer 400 is also less, after at least a part of the connecting electrode 600 is lapped with the sidewall of the first via V1 in the first insulating layer 200, the great lap joint effect of at least the part of the connecting electrode 600 with the sidewall of the first via V1 in the first insulating layer 200 is ensured, such that the display effect of the display device provided with the array substrate according to the embodiments of the present disclosure is great.

In the embodiments of the present disclosure, the first insulating layer 200 and the third insulating layer 400 are both formed by a SiNx (x>0) material, and the second insulating layer 300 is formed by a SiOy (y>0) material. It should be noted that SiNx refers to a substance containing nitrogen in composition and containing elements in any concentration with a range of 10% to 50% atoms of silicon, a range of 5% to 25% atoms of hydrogen, and a sum of 100% atoms. SiOy refers to a substance containing oxygen in composition and containing elements in any concentration with a range of 10% to 50% atoms of silicon, a range of 1% to 25% atoms of hydrogen, and a sum of 100% atoms. In some embodiments, the first insulating layer 200 and the third insulating layer 400 include a silicon nitride material, and the second insulating layer 300 includes a silicon oxide material.

The process of forming the second lap joint via V20 shown in FIG. 7 are described in detail in the following embodiments.

Figure 8:
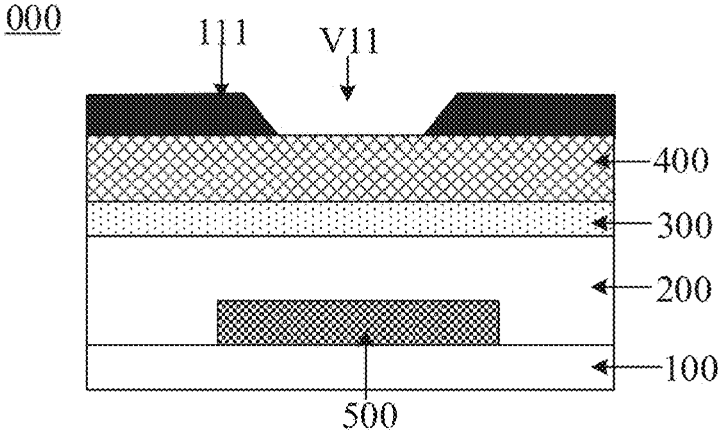
FIG. 8 is a schematic diagram of an array substrate including a photoresist thin film according to some embodiments of the present disclosure.

For a manner for forming a photoresist pattern on the array substrate 000, referring to FIG. 8, FIG. 8 is a schematic diagram of an array substrate including a photoresist thin film according to some embodiments of the present disclosure. After forming the photoresist pattern 111 on the array substrate 000 including the first insulating layer 200, the second insulating layer 300, and the third insulating layer 400, the photoresist pattern 111 is baked. An edge, proximal to an opening hole V11, of the photoresist pattern 111 upon being baked collapses, such that a part, proximal to the opening hole V11, of the photoresist pattern 111 forms a gradient angle. Illustratively, the angle between a face, proximal to the substrate 100, of the photoresist pattern 111 and a side face of the opening hole V11 is less than or equal to 50° by controlling the baking process. It should be noted that the baked photoresist pattern 111 shows a great strength and thus is not prone to deformation upon being bombarded by using the etching gas. FIG. 6 is illustrated by taking the photoresist thin film 111 including one opening hole part an example. In this case, an etching gas enters from the opening hole V11 and sequentially etches the third insulating layer 400, the second insulating layer 300, and the first insulating layer 200 in subsequently etching the third insulating layer 400, the second insulating layer 300, and the first insulating layer 200. Moreover, as the angle between the face, proximal to the substrate 100, of the baked photoresist pattern 111 and the side face of the opening hole part is less than or equal to 50°, a lateral thickness of a part, proximal to the opening hole V11, of the photoresist pattern 111 is less, such that the part, proximal to the opening hole V11, of the photoresist pattern 111 is prone to retraction under the action of the etching gas. Thus, the problem that a hole is formed on the sidewalls of the first via V1, the second via V2, and the third via V3 (i.e., the second lap joint via V20) caused by the slow retraction of the part, proximal to the opening hole V11, of the photoresist pattern 111 in the following process is avoided, and the probability of the disconnection in the connecting electrode 600 in the second lap joint via V20 in the following process is further reduced.

Figure 9:
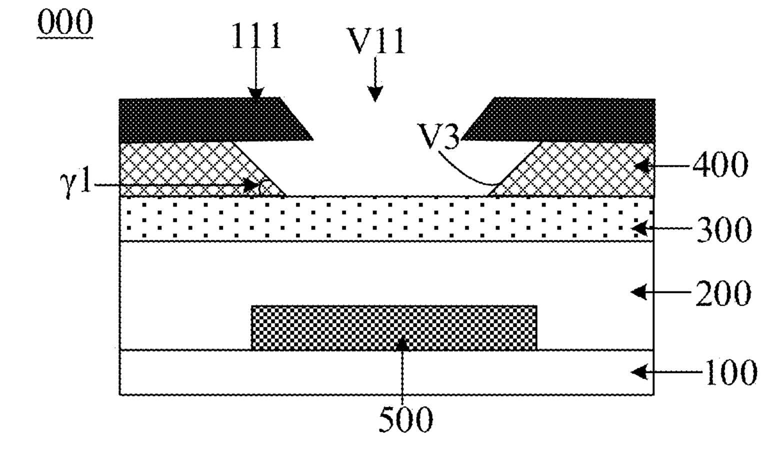
FIG. 9 is a schematic diagram of an array substrate forming a third via according to some embodiments of the present disclosure.

For a manner for forming the third via V3 in the third insulating layer 400, referring to FIG. 9, FIG. 9 is a schematic diagram of an array substrate forming a third via according to some embodiments of the present disclosure. After the photoresist pattern 111 is formed on the array substrate 000, and the photoresist pattern 111 is baked, a mixed gas of at least one of a sulfur hexafluoride gas, a sulfur tetrafluoride gas, a carbon tetrafluoride gas, and a nitrogen fluoride gas, and the oxygen gas is taken as a first etching gas to etch the third insulating layer 400 on the array substrate 000, such that a third via V3 in communication with the opening hole V11 of the photoresist pattern 111 is formed in the third insulating layer 400. As the third insulating layer 400 is formed by a silicon nitride material, and the rate of etching the silicon nitride material by using the first etching gas is great, and the rate of longitudinally etching the silicon nitride material by using the first etching gas is generally greater than 10000 angstrom per minute, the time for etching the third via V3 in the third insulating layer 400 is shortened, and thus the efficiency of manufacturing the array substrate 00 is improved.

In addition, as the second insulating layer 300 is formed by a silicon oxide material, the rate of etching the silicon oxide material by using the first etching gas is less. Therefore, after the third insulating layer 400 is longitudinally etched by using the first etching gas, although the first etching gas etches the second insulating layer 300, the second insulating layer 300 is not greatly affected. Moreover, as the first etching gas further shows a great lateral etching capability, in etching the third insulating layer 400 by using the first etching gas, the third insulating layer 400 is inwardly retracted relative to the photoresist pattern 111, such that the third via V3 including a great opening is formed in the third insulating layer 400. That is, an orthogonal projection of the opening hole V11 of the photoresist pattern 111 on the substrate 100 is within the orthogonal projection of the third via V3 on the substrate 100. Moreover, in a case that a capability of the first etching gas to laterally etch the third insulating layer 400 is great, an included angle $\gamma 1$ between the sidewall of the third via V3 in the third insulating layer 400 and the face, proximal to the substrate 100, of the third insulating layer 400 is ensured to be less than or equal to 45°. Illustratively, in a case that the thickness of the third insulating layer 400 is 0.4 micron, the opening, facing away from the substrate 100, of the third insulating layer 400 is 9.7 microns, the opening, proximal to the substrate 100, of the third insulating layer 400 is 8.8 microns, and a length of the sidewall of the third via V3 is greater than 0.4 micron.

Figure 10:
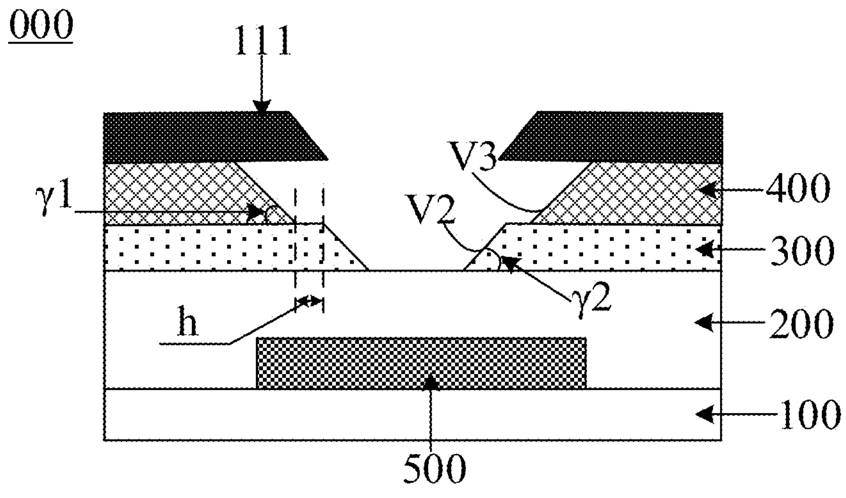
FIG. 10 is a schematic diagram of an array substrate forming a second via according to some embodiments of the present disclosure.

For a manner for forming the second via V2 in the second insulating layer 300, referring to FIG. 10, FIG. 10 is a schematic diagram of an array substrate forming a second via according to some embodiments of the present disclosure. After the third via V3 is formed in the third insulating layer 400, the second insulating layer 300 in the array substrate 000 is etched by using a mixed gas, as a second etching gas, of the nitrogen trifluoride gas and the oxygen gas, such that a second via V2 in communication with the third via V3 is formed in the second insulating layer 300. The second insulating layer 300 is formed by a silicon oxide material, the rate of etching the silicon oxide material by using the second etching gas is great, and the rate of longitudinally etching the silicon oxide material by using the second etching gas is generally about 4000 angstroms per minute. Thus, the time for forming the second via V2 by etching the second insulating layer 300 is greatly shortened, such that the efficiency of manufacturing the array substrate 000 is further improved.

In addition, as the capability of the second etching gas to laterally etch is poor, in etching the second insulating layer 300 by using the second etching gas, the second insulating layer 300 is not inwardly retracted relative to the photoresist pattern 111. That is, the second insulating layer 300 is not prone to being etched by using the second etching gas in the lateral direction, such that after the second via V2 is formed in the second insulating layer 300, the second insulating layer 300 protrudes from the third insulating layer 400, and the part, protruding from the third insulating layer 400, of the second insulating layer 300 is a stepped structure. A width of the stepped structure is the distance h between the outer boundary of the orthogonal projection of the opening, facing away from the substrate 100, of the second via V2 in the second insulating layer 300 on the substrate 100 and the outer boundary of the orthogonal projection of the opening, proximal to the substrate 100, of the third via V3 in the third insulating layer 400 on the substrate 100.

Figure 11:
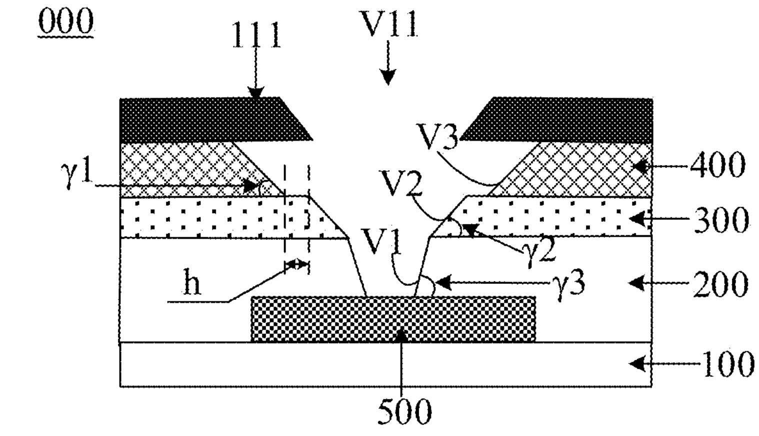
FIG. 11 is a schematic diagram of an array substrate forming a first via according to some embodiments of the present disclosure.

For a manner for forming the first via V1 in the first insulating layer 200, referring to FIG. 11, FIG. 11 is a schematic diagram of an array substrate forming a first via according to some embodiments of the present disclosure. After the second via V2 is formed in the second insulating layer 300, the mixed gas of the nitrogen trifluoride gas and the oxygen gas is also taken as the second etching gas to etch the first insulating layer 200 in the array substrate 000, such that a first via V1 in communication with the second via V2 is formed in the first insulating layer 200. As the first insulating layer 200 is formed by a silicon nitride material, and a rate of etching the silicon nitride material by using the second etching gas is greater than a rate of etching the silicon oxide material by using the second etching gas, and the rate of longitudinally etching the silicon oxide material by using the second etching gas is generally about 11000 angstroms per minute, the time for forming the second via V1 by etching the first insulating layer 200 is greatly shortened, such that the efficiency of manufacturing the array substrate 00 is further improved. In addition, an included angle γ3 between the sidewall of the first via V1 in the first insulating layer 300 and the face, proximal to the substrate 100, of the first insulating layer 200 is greater than or equal to 80° and less than 90°.

In addition, as a capability of the second etching gas to laterally etch is poor, in etching the first insulating layer 200 by using the second etching gas, the first insulating layer 200 is not inwardly retracted relative to the photoresist pattern 111, that is, the first insulating layer 200 is not prone to being etched by using the second etching gas in the lateral direction. In this way, the outer boundary of the orthogonal projection of the opening, facing away from the substrate 100, of the first via V1 in the first insulating layer 200 on the substrate 100 is overlapped with the outer boundary of the orthogonal projection of the opening, proximal to the substrate 100, of the second via V2 in the second insulating layer 300 on the substrate 100.

It should be noted that the thickness of the second insulating layer 300 according to the embodiments of the present disclosure is adjustable, and after the thickness of the second insulating layer 300 is adjusted, the time of etching the insulating layer is substantially unchanged in a case that the array substrate 000 forms the second lap joint via V20 by etching. Therefore, in forming the second lap joint via V20, the amount of inward retraction of the photoresist pattern 20 under the action of the etching gases (i.e., the first etching gas and the second etching gas) is substantially unchanged, and the width of the stepped structure in the second lap joint via V20 is also substantially unchanged. In this way, a size of the included angle γ2 between the sidewall of the second via V2 in the second insulating layer 300 and the face, proximal to the substrate 100, of the second insulating layer 300 is positively correlated with the thickness of the second insulating layer 300. Illustratively, the embodiments of the present disclosure are illustrated by taking the following two cases as examples.

Figure 12:
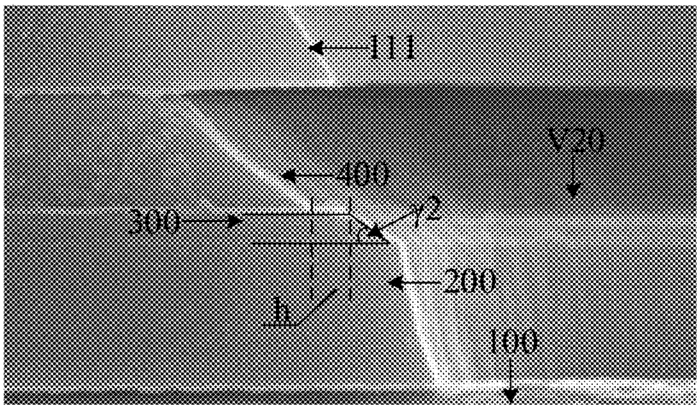
FIG. 12 is a cross-sectional scanning electron microscope image of a second lap joint via formed in an array substrate according to some embodiments of the present disclosure.

In a first case, as shown in FIG. 12, FIG. 12 is a practical schematic diagram of a second lap joint via formed in an array substrate according to some embodiments of the present disclosure. In a case that the thickness of the second insulating layer 300 ranges from 500 angstroms to 1000 angstroms, the included angle γ2 between the sidewall of the second via V2 and the face, proximal to the substrate 100, of the second insulating layer 300 is less than or equal to 50°.

Figure 13:
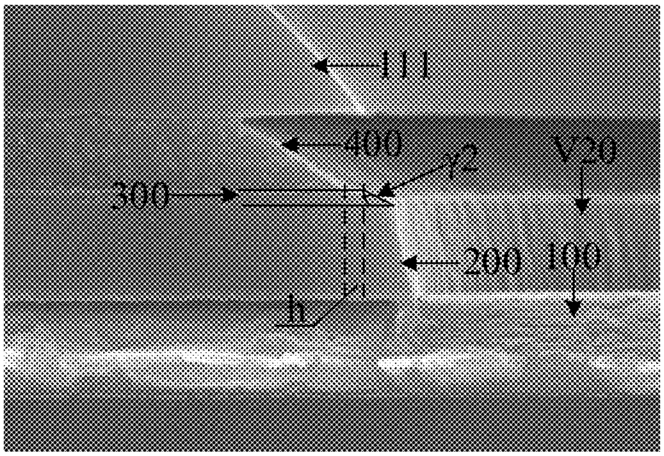
FIG. 13 is a cross-sectional scanning electron microscope image of another second lap joint via formed in an array substrate according to some embodiments of the present disclosure.

In a second case, referring to FIG. 13, FIG. 13 is a practical schematic diagram of a second lap joint via formed in another array substrate according to some embodiments of the present disclosure. In a case that the thickness of the second insulating layer 300 ranges from 200 angstroms to 500 angstroms, the included angle γ2 between the sidewall of the second via V2 and the face, proximal to the substrate 100, of the second insulating layer 30 is less than or equal to 30°.

In the embodiments of the present disclosure, as shown in FIG. 12 and FIG. 13, as the etching rate of using two etching gases (the first etching gas and the second etching gas) with different etching properties in forming the second lap joint via V20 in the array substrate 000 is great, compared with the first via formed by long-time etching in the above description, the columnar compound is not present in the second lap joint via V20 in the GOA circuit 002 in the array substrate 000 upon the one patterning process in the embodiments of the present disclosure. In this way, the connecting electrode 600 in the second lap joint via V20 is not prone to poor lap joint, such that the connecting electrode 600 is in great lap joint with the first electrode 500, and the electrical connection effect of different TFTs of the GOA circuit 002 is ensured to be great.

Figure 14:
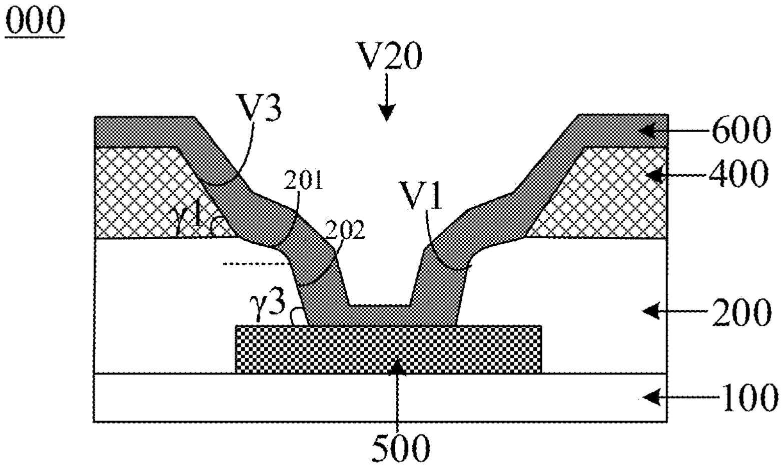
FIG. 14 is a schematic structural diagram of film layers of another array substrate according to some embodiments of the present disclosure.

In second optional implementations, referring to FIG. 14, FIG. 14 is a schematic structural diagram of film layers of another array substrate according to some embodiments of the present disclosure. The array substrate 000 includes: a substrate 100, a first insulating layer 200, a third insulating layer 400, a first electrode 500, and a connecting electrode 600.

The first insulating layer 200 and the third insulating layer 400 are sequentially laminated in a direction perpendicular to and away from the substrate 100. The first insulating layer 200 is provided with a first via V1, and the third insulating layer 400 is provided with a third via V3 in communication with the first via V1. The first via V1 and the third via V3 form the second lap joint via V20 according to the above embodiments.

An orthogonal projection of an opening, facing away from the substrate 100, of the first via V1 on the substrate 100 is within an orthogonal projection of an opening, proximal to the substrate 100, of the third via V3 on the substrate 100, and an outer boundary of the orthogonal projection of the opening, facing away from the substrate 100, of the first via V1 on the substrate 100 is not overlapped with an outer boundary of the orthogonal projection of the opening, proximal to the substrate 100, of the third via V3 on the substrate 100. In this way, in the second lap joint via V20 formed by the first via V1 and the third via V3, the first insulating layer 200 protrudes from the third insulating layer 400.

The first electrode 500 is disposed on a side, proximal to the substrate 100, of the first insulating layer 200, and an orthogonal projection of the first electrode 500 on the substrate 100 is at least partially overlapped with an orthogonal projection of the first via V1 on the substrate 100. In this way, at least a part of the first electrode 500 is within the first via V1 in the first insulating layer 200. The first electrode 500 is a gate of a TFT in the GOA circuit 001 according to the above embodiments.

The connecting electrode 600 is disposed on a side, facing away from the substrate 100, of the third insulating layer 400, and at least a part of the connecting electrode 600 is within the first via V1 and the third via V3, and is lapped with the first electrode 500.

In the embodiments of the present disclosure, as in the second lap joint via V20 formed by the first via V1 and the third via V3, the first insulating layer 200 protrudes from the third insulating layer 400, and the part of the first insulating layer 200 protruding from the third insulating layer 400 is a stepped structure, a part of the connecting electrode 600 is disposed on the stepped structure in a case that at least a part of the connecting electrode 600 is within the second lap joint via V20. In this case, the problem of the disconnection of the connecting electrode 600 in the second lap joint via V20 is less likely to occur, such that the lap joint effect of the connecting electrode 600 with the first electrode 500 is ensured to be great. As such, the effect of the electrical connection between different TFTs of GOA circuit 002 is ensured to be great, such that the display effect of the display device disposed with the array substrate according to the embodiments of the present disclosure is great.

In the present disclosure, the distance h between the outer boundary of the orthogonal projection of the opening, proximal to the substrate 100, of the first via V1 in the first insulating layer 200 on the substrate 100 and the outer boundary of the orthogonal projection of the opening, proximal to the substrate 100, of the third via V3 in the third insulating layer 400 on the substrate 100 is a width of the stepped structure of the part of the first insulating layer 200 protruding from the third insulating layer 400. In a case that the width of the stepped structure ranges from 0.2 micron to 0.5 micron, the probability of disconnection of the connecting electrode 600 within the second lap joint via V20 is further reduced in the case that at least a part of the connecting electrode 600 is within the second lap joint via V20.

In the embodiments of the present disclosure, the included angle γ between the sidewall of the third via V3 and the face, proximal to the substrate 100, of the third insulating layer 400 is less than or equal to 45°. a thickness of the third insulating layer 400 ranges from 1000 angstroms to 4000 angstroms. Compared with the great gradient angle α of the second passivation layer 06 in the array substrate described above, the included angle γ1 between the sidewall of the third via V3 and the face, proximal to the substrate 100, of the third insulating layer is less in the embodiments of the present disclosure, such that the disconnection of the connecting electrode 600 at a position inside the first via V1 and outside the first via V1 is less likely to occur.

In the present disclosure, a part, proximal to the third insulating layer 400, of the sidewall of the first via V1 in the first insulating layer 200 is an arc-shaped sidewall 201. In the second lap joint via V20 formed by the first via V1 and the third via V3, the sidewall of the first via V1 in the first insulating layer 200 is proximal to the partial arc-shaped sidewall 201 of the third insulating layer 400, that is, a part, proximal to the third insulating layer 400, of the stepped structure is the arc-shaped sidewall 201. In this way, after at least a part of the connecting electrode 600 is within the second lap joint via V20, the part of the connecting electrode 600 is lapped with the arc-shaped sidewall 201. Therefore, the lap joint effect of the connecting electrode 600 with the first insulating layer 200 and the third insulating layer 400 in the second lap joint via V20 is great, and thus the lap joint effect of the connecting electrode 600 with the first electrode 500 is ensured to be great. Thus, the probability of the disconnection of the connecting electrode 600 within the second lap joint via V20 is further reduced.

In the embodiments of the present disclosure, the included angle between the arc-shaped sidewall 201, proximal to the third insulating layer 400, of the sidewall of the first via V1 in the first insulating layer 200 and the face, proximal to the substrate 100, of the first insulating layer 200 is less than or equal to 30°. As the included angle between the arc-shaped sidewall 201 and the face, proximal to the substrate 100, of the first insulating layer 200 is less, at least a part of the connecting electrode 600 is easily lapped with the arc-shaped sidewall 201 of the first via V1 in the first insulating layer 200. In this way, after at least a part of the connecting electrode 600 is within the second lap joint via V20, the lap joint effect of at least a part of the connecting electrode 600 with the arc-shaped sidewall 201 of the first via V1 in the first insulating layer 200 is ensured to be great, and thus the lap joint effect of the connecting electrode 600 with the first electrode 500 is ensured to be great.

In the present disclosure, the sidewall of the first via V1 in the first insulating layer 200 is further provided with a planar sidewall 202 on the side, proximal to the substrate 100, of the arc-shaped sidewall 201, and an included angle γ3 between the planar sidewall 202 and the face, proximal to the substrate 100, of the first insulating layer 200 is greater than or equal to 80° and less than 90°. The included angle γ3 between the planar sidewall 202 of the first via V1 in the first insulating layer 200 and the face, proximal to the substrate 100, of the first insulating layer 200 is great. However, as the included angle between the arc-shaped sidewall 201 of the first via V1 in the first insulating layer 200 and the face, proximal to the substrate 100, of the first insulating layer 200 is less, after at least a part of the connecting electrode 600 is within the second lap joint via V20, the lap joint effect of at least a part of the connecting electrode 600 with the planar sidewall 202 of the first via V1 in the first insulating layer 200 is ensured to be great, and thus the lap joint effect of the connecting electrode 600 with the first electrode 500 is ensured to be great.

In the embodiments of the present disclosure, the first insulating layer 200 and the third insulating layer 400 are both formed by a silicon nitride material.

The process of forming the second lap joint via V20 shown in FIG. 14 are described in detail in following embodiments.

Figure 15:
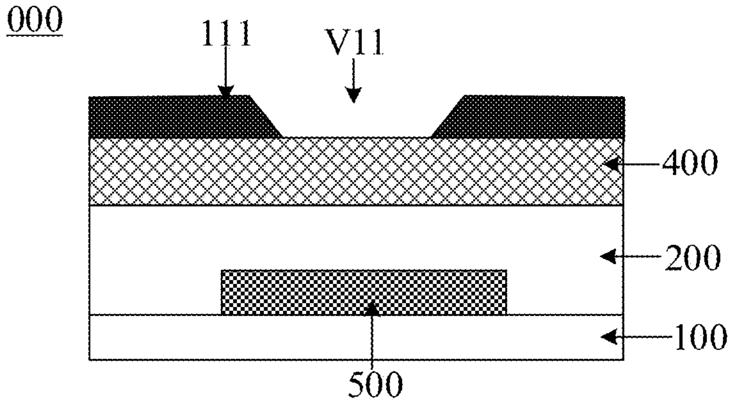
FIG. 15 is a schematic diagram of another array substrate including a photoresist thin film according to some embodiments of the present disclosure.

For a manner for forming a photoresist pattern on the array substrate 000, referring to FIG. 15, FIG. 15 is a schematic diagram of another array substrate including a photoresist thin film according to some embodiments of the present disclosure. After forming the photoresist pattern 111 on the array substrate 000 including the first insulating layer 200 and the third insulating layer 400, the photoresist pattern 111 is baked. An edge, proximal to an opening hole V11 of the photoresist pattern 111 upon being baked collapses, such that a part, proximal to the opening hole V11, of the photoresist pattern 111 forms a gradient angle. Illustratively, the included angle between the face, proximal to the substrate 100, of the photoresist pattern 111 upon being baked and a side face of the opening hole V11 is less than or equal to 50°. It should be noted that the baked photoresist pattern 111 shows a great strength and thus is not prone to deformation upon being bombarded by using the etching gas. FIG. 15 is illustrated by taking the photoresist thin film 111 including one opening hole part an example. In this case, an etching gas enters from the opening hole V11 and sequentially etches the third insulating layer 400 and the first insulating layer 200 in subsequently etching the third insulating layer 400 and the first insulating layer 200 are. Moreover, as the angle between the face, proximal to the substrate 100, of the baked photoresist pattern 111 and the side face of the opening hole part is less than or equal to 50°, a lateral thickness of a part, proximal to the opening hole V11, of the photoresist pattern 111 is relatively less, such that the part, proximal to the opening hole V11, of the photoresist pattern 111 is prone to retraction under the action of the etching gas. Thus, the problem that a hole is formed on the sidewalls of the first via V1 and the third via V3 (i.e., the second lap joint via V20) caused by the slow retraction of the part, proximal to the opening hole V11, of the photoresist pattern 111 in the following process is avoided, and the probability of the disconnection in the connecting electrode 600 in the second lap joint via V20 in the following process is further reduced.

Figure 16:
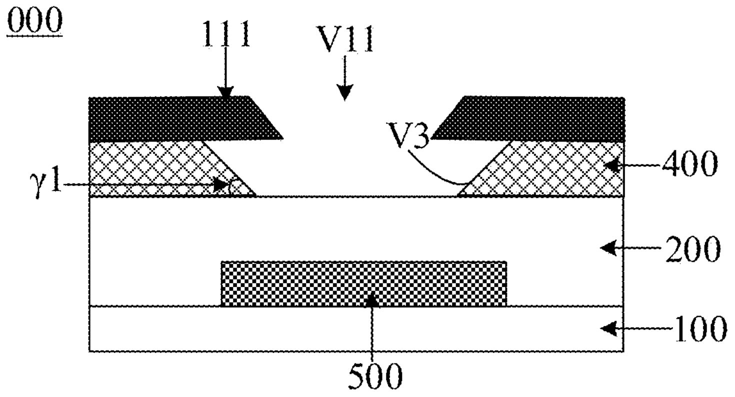
FIG. 16 is a schematic diagram of another array substrate forming a third via according to some embodiments of the present disclosure.

For a manner for forming the third via V3 in the third insulating layer 400, referring to FIG. 16, FIG. 16 is a schematic diagram of another array substrate forming a third via according to some embodiments of the present disclosure. After the photoresist pattern 111 is formed on the array substrate 000, and the photoresist pattern 111 is baked, a mixed gas of a sulfur hexafluoride gas and an oxygen gas is taken as a first etching gas to etch the third insulating layer 400 on the array substrate 000, such that a third via V3 in communication with the opening hole V11 of the photoresist pattern 111 is formed in the third insulating layer 400. It should be noted that for the process of forming the second lap joint via V20 shown in FIG. 14 in the present disclosure and the detailed manner of forming the third via V3 in the third insulating layer 400, references may be made to the manner of forming the third via V3 in the third insulating layer 400 in the above embodiments, which are not described in the present disclosure.

Figure 17:
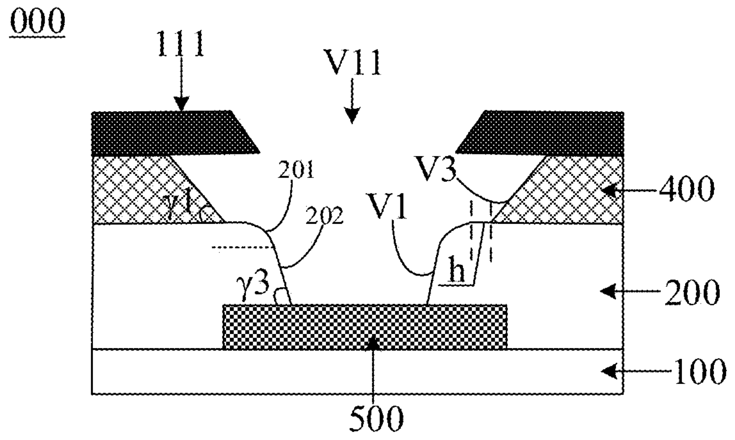
FIG. 17 is a schematic diagram of another array substrate forming a first via according to some embodiments of the present disclosure.

For a manner for forming the first via V1 in the first insulating layer 200, referring to FIG. 17, FIG. 17 is a schematic diagram of another array substrate forming a first via according to some embodiments of the present disclosure. After the third via V3 is formed in the third insulating layer 400, the mixed gas of the nitrogen trifluoride gas and the oxygen gas is also taken as the second etching gas to etch the first insulating layer 200 in the array substrate 000, such that a first via V1 in communication with the third via V3 is formed in the first insulating layer 200. As the first insulating layer 200 is formed by a silicon nitride material, the rate of etching the silicon nitride material by using the second etching gas is great, and the rate of longitudinally etching the silicon oxide material by using the second etching gas is generally about 11000 angstroms per minute, the time for forming the second via V1 by etching the first insulating layer 200 is greatly shortened, such that the efficiency of manufacturing the array substrate 00 is further improved.

In addition, as the capability of the first etching gas to laterally etch is great, and the capability of the second etching gas to laterally etch is poorer than the capability of the first etching gas to laterally etch, in etching the third insulating layer 400 by using the first etching gas, the third insulating layer 400 is inwardly retracted relative to the photoresist pattern 111, such that the third via V3 including a great opening is formed in the third insulating layer 400. As the capability of the second etching gas to laterally etch is poor, in etching the first insulating layer 200 by using the second etching gas, the first insulating layer 200 is not inwardly retracted relative to the photoresist pattern 111. That is, the first insulating layer 200 is not prone to being etched by using the second etching gas in the lateral direction, such that after the first via V1 is formed in the first insulating layer 200, the first insulating layer 200 protrudes from the third insulating layer 400, and the part, protruding from the third insulating layer 400, of the first insulating layer 200 is a stepped structure. A width of the stepped structure is the distance h between the outer boundary of the orthogonal projection of the opening, proximal to the substrate 100, of the first via V1 in the first insulating layer 200 on the substrate 100 and the outer boundary of the orthogonal projection of the opening, proximal to the substrate 100, of the third via V3 in the third insulating layer 400 on the substrate 100.

In addition, as the first insulating layer 200 is not retracted relative to the photoresist pattern 111, the photoresist pattern 111 does not block a part of a face, proximal to the third insulating layer 400, of the first insulating layer 200. Moreover, as a bombardment effect of the second etching gas is great, the part of the face, proximal to the third insulating layer 400, of the first insulating layer 200 and not blocked by the photoresist pattern 111 is strongly bombarded, such that a part, proximal to the third insulating layer 400, of the sidewall of the first via V1 in the first insulating layer 200 is an arc-shaped sidewall 201. Moreover, as the bombardment effect of the second etching gas is great, the included angle between the arc-shaped sidewall,, proximal to the third insulating layer 400, of the sidewall of the first via V1 in the first insulating layer 200 and the face, proximal to the substrate 100, of the first insulating layer 200 is less than or equal to 30°.

Thereafter, as the part of the face, proximal to the third insulating layer 400, of the first insulating layer 200 is bombarded by using the second etching gas, the part of the face, proximal to the substrate 100, of the first insulating layer 200 is protected. In this way, in the sidewall of the first via V1 in the first insulating layer 200, a part of a face proximal to the substrate 100 is a planar sidewall 202. Moreover, as the rate of longitudinally etching the silicon oxide material by using the second etching gas is great, the included angle between the planar sidewall 202 in the first insulating layer 200 and the face, proximal to the substrate 100, of the first insulating layer 200 is great. As such, the sidewall of the first via V1 in the first insulating layer 200 is further provided with a planar sidewall 202 on the side, proximal to the substrate 100, of the arc-shaped sidewall 201, and the included angle γ3 between the planar sidewall 202 and the face, proximal to the substrate 100, of the first insulating layer 200 is greater than or equal to 80° and less than 90°.

Figure 18:
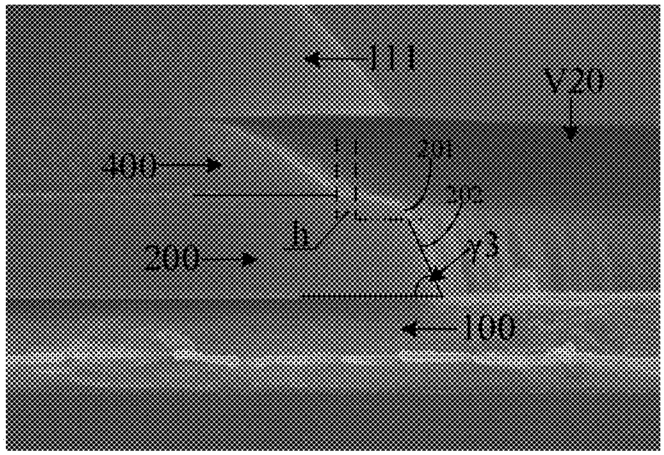
FIG. 18 is a cross-sectional scanning electron microscope image of another second lap joint via formed in an array substrate according to some embodiments of the present disclosure.

In the embodiments of the present disclosure, referring to FIG. 18, FIG. 18 is a practical schematic diagram of a second lap joint via formed in another array substrate according to some embodiments of the present disclosure. As the etching rate of using two etching gases (the first etching gas and the second etching gas) with different etching properties in forming the second lap joint via V20 in the array substrate 000 as shown in FIG. 14 is great, compared with the first via formed by long-time etching in the above description, the columnar compound is not present in the second lap joint via V20 in the GOA circuit 002 in the array substrate 000 upon the one patterning process in the embodiments of the present disclosure. In this way, the connecting electrode 600 in the second lap joint via V20 is not prone to poor lap joint, such that the connecting electrode 600 is in great lap joint with the first electrode 500, and the electrical connection effect of different TFTs of the GOA circuit 002 is ensured to be great.

Figure 19:
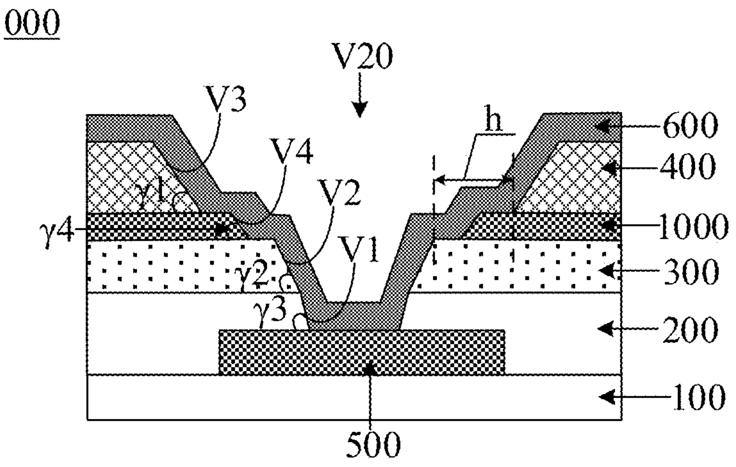
FIG. 19 is a schematic structural diagram of film layers of another array substrate according to some embodiments of the present disclosure.

In third optional implementations, referring to FIG. 19, FIG. 19 is a schematic structural diagram of film layers of still another array substrate according to some embodiments of the present disclosure. The array substrate 000 includes: a substrate 100, a first insulating layer 200, a second insulating layer 300, a third insulating layer 400, a fourth insulating layer 1000, a first electrode 500, and a connecting electrode 600.

The first insulating layer 200, the second insulating layer 300, the fourth insulating layer 1000, and the third insulating layer 400 are sequentially laminated in a direction perpendicular to and away from the substrate 100. The first insulating layer 200 is provided with a first via V1, the second insulating layer 300 is provided with a second via V2 in communication with the first via V1, the fourth insulating layer 1000 is provided with a fourth via V4 in communication with the second via V2, and the third insulating layer 400 is provided with a third via V3 in communication with the fourth via V4. The first via V1, the second via V2, the fourth via V4 and the third via V3 form the second lap joint via V20 according to the above embodiments.

An orthogonal projection of an opening, facing away from the substrate 100, of the fourth via V4 on the substrate 100 is within an orthogonal projection of an opening, proximal to the substrate 100, of the third via V3 on the substrate 100, and an outer boundary of the orthogonal projection of the opening, facing away from the substrate 100, of the fourth via V4 on the substrate 100 is not overlapped with an outer boundary of the orthogonal projection of the opening, proximal to the substrate 100, of the third via V3 on the substrate 100. In this way, the fourth insulating layer 1000 protrudes from the third insulating layer 400 in the through holes formed by the fourth via V4 and the third via V3. An orthogonal projection of an opening, facing away from the substrate 100, of the second via V2 on the substrate 100 is within an orthogonal projection of an opening, proximal to the substrate 100, of the fourth via V4 on the substrate 100, and an outer boundary of the orthogonal projection of the opening, facing away from the substrate 100, of the second via V2 on the substrate 100 is not overlapped with an outer boundary of the orthogonal projection of the opening, proximal to the substrate 100, of the fourth via V4 on the substrate 100. In this way, the second insulating layer 300 protrudes from the fourth insulating layer 1000 in the through holes formed by the fourth via V4 and the second via V2.

The first electrode 500 is disposed on a side, proximal to the substrate 100, of the first insulating layer 200, and an orthogonal projection of the first electrode 500 on the substrate 100 is at least partially overlapped with an orthogonal projection of the first via V1 on the substrate 100. In this way, at least a part of the first electrode 500 is within the first via V1 in the first insulating layer 200. The first electrode 500 is a gate of a TFT in the GOA circuit 001 according to the above embodiments.

The connecting electrode 600 is disposed on a side, facing away from the substrate 100, of the third insulating layer 400, and at least a part of the connecting electrode 600 is within the first via V1, the second via V2, the fourth via V4, and the third via V3, and is lapped with the first electrode 500.

In the embodiments of the present disclosure, as in the second lap joint via V20 formed by the first via V1, the second via V2, the fourth via V4, and the third via V3, the second insulating layer 300 protrudes from the fourth insulating layer 1000, and the fourth insulating layer 1000 protrudes from the third insulating layer 400, a part, protruding from the fourth insulating layer 1000, of the second insulating layer 300 is a first step, a part, protruding from the third insulating layer 400, of the fourth insulating layer 1000 is a second step, and the first step and the second step form a stepped structure. In a case that at least a part of the connecting electrode 600 is within the second lap joint via V20, a part of the connecting electrode 600 is disposed on the stepped structure. In this case, the problem of the disconnection of the connecting electrode 600 in the second lap joint via V20 is less likely to occur, such that the lap joint effect of the connecting electrode 600 with the first electrode 500 is great. As such, the effect of the electrical connection between different TFTs of GOA circuit 002 is ensured to be great, such that the display effect of the display device disposed with the array substrate according to the embodiments of the present disclosure is great.

In the present disclosure, the outer boundary of the orthogonal projection of the opening, facing away from the substrate 100, of the first via V1 in the first insulating layer 200 on the substrate 100 is overlapped with the outer boundary of the orthogonal projection of the opening, proximal to the substrate 100, of the second via V2 in the second insulating layer 300 on the substrate 100. Compared with the above description in which the unnecessary protrusion is easily generated at the position Q in the via in the array substrate, the unnecessary protrusion is not present at a contact position of the first insulating layers 200 and the second insulating layers 300 in the communicated first via V1 and second via V2 in the embodiments of the present disclosure, such that the lap joint effect of the connecting electrode 600 with the first insulating layer 200 and the second insulating layer 300 is great. Thus, the probability of the disconnection of the connecting electrode 600 in the second lap joint via V20 is further reduced.

In the embodiments of the present disclosure, an included angle $\gamma 3$ between a sidewall of the third via V3 and a face, proximal to the substrate 100, of the third insulating layer 400 is less than or equal to 45°. A thickness of the third insulating layer 400 ranges from 1000 angstroms to 4000 angstroms. Compared with the great gradient angle $\alpha$ of the second passivation layer 06 in the array substrate described above, the included angle $\gamma 1$ between the sidewall of the third via V3 and the face proximal to the substrate 100 is less in the embodiments of the present disclosure, such that the disconnection of the connecting electrode 600 at a position inside the first via V1 and outside the first via V1 is less likely to occur.

In the present disclosure, the fourth insulating layer 1000 and the second insulating layer 300 are both formed by SiOy, and a film layer density of the fourth insulating layer 1000 is less than a film layer density of the second insulating layer 300. In some embodiments of the present disclosure, materials of the second insulating layer 300 and the fourth insulating layer 1000 are a silicon oxide material. The thickness of the second insulating layer 300 ranges from 500 angstroms to 700 angstroms. The thickness of the second insulating layer 300 is greater than the thickness of the fourth insulating layer 1000. As a temperature of forming the second insulating layer 300 is high, a film quality of silicon oxide of the second insulating layer 300 is compact. As the fourth insulating layer 1000 is generally disposed on a side, facing away from the substrate 100, of the TFT active layer in the GOA circuit 002, and the TFT active layer in the GOA circuit 002 does not resist a high temperature, the temperature of forming the fourth insulating layer 1000 is low, such that the film quality of the silicon oxide of the fourth insulating layer 1000 is less. In this case, as the film quality of the fourth insulating layer 1000 is less than the film quality of the second insulating layer 300, a stepped structure is formed between the second insulating layer 300 and the third insulating layer 400 in the second lap joint via V20, and the lap joint effect of the connecting electrode 600 with the first electrode 500 is ensured to be great.

In the embodiments of the present disclosure, the distance h between the outer boundary of the orthogonal projection of the opening, facing away from the substrate 100, of the second via V2 on the substrate 100 and the outer boundary of the orthogonal projection of the opening, proximal to the substrate 100, of the third via V3 on the substrate 100 ranges from 0.4 micron to 0.6 micron. Here, the distance h between the outer boundary of the orthogonal projection of the opening, facing away from the substrate 100, of the second via V2 in the second insulating layer 300 on the substrate 100 and the outer boundary of the orthogonal projection of the opening, proximal to the substrate 100, of the third via V3 in the third insulating layer 400 on the substrate 100 is the stepped structure formed by the first step and the second step. A width of the stepped structure is the distance h between the outer boundary of the orthogonal projection of the opening, facing away from the substrate 100, of the second via V2 on the substrate 100 and the outer boundary of the orthogonal projection of the opening, proximal to the substrate 100, of the third via V3 on the substrate 100. In a case that the width of the stepped structure ranges from 0.4 micron to 0.6 micron, the probability of disconnection of the connecting electrode 600 within the second lap joint via V20 is further reduced in a case that at least a part of the connecting electrode 600 is within the second lap joint via V20.

In the present disclosure, in a case that the thickness of the second insulating layer 300 ranges from 500 angstroms to 700 angstroms, the included angle γ2 between the sidewall of the second via V2 and the face, proximal to the substrate 100, of the second insulating layer 300 is less than or equal to 50°. The smaller the included angle γ2 between the sidewall of the second via V2 in the second insulating layer 300 and the face, proximal to the substrate 100, of the second insulating layer 300, the easier for the lap joint between the connecting electrode 600 with the sidewall of the second via V2 in the second insulating layer 300, such that the disconnection of the connecting electrode 600 in the second lap joint via V20 is less likely to occur.

In the embodiments of the present disclosure, the included angle γ3 between the sidewall of the first via V1 in the first insulating layer 200 and the face, proximal to the substrate 100, of the first insulating layer 200 is greater than or equal to 80° and less than 90°. The included angle γ3 between the sidewall of the first via V1 in the first insulating layer 200 and the face, proximal to the substrate 100, of the first insulating layer 200 is great. However, as the included angle γ2 between the sidewall of the second via V2 in the second insulating layer 300 and the face, proximal to the substrate 100, of the second insulating layer 300 is less, in the case that at least a part of the connecting electrode 600 is lapped with the sidewall of the first via V1 in the first insulating layer 200, the lap joint effect of at least a part of the connecting electrode 600 with the sidewall of the first via V1 in the first insulating layer 200 is ensured to be great, such that the display effect of the display device disposed with the array substrate according to the embodiments of the present disclosure is great.

In the present disclosure, the first insulating layer 200 and the third insulating layer 400 are both formed by a silicon nitride material, and the second insulating layer 300 and the fourth insulating layer 1000 are both formed by a silicon oxide material. In addition, a density of the silicon oxide of the fourth insulating layer 1000 is less than a density of the silicon oxide of the second insulating layer 300.

The process of forming the second lap joint via V20 shown in FIG. 19 are described in detail in following embodiments.

Figure 20:
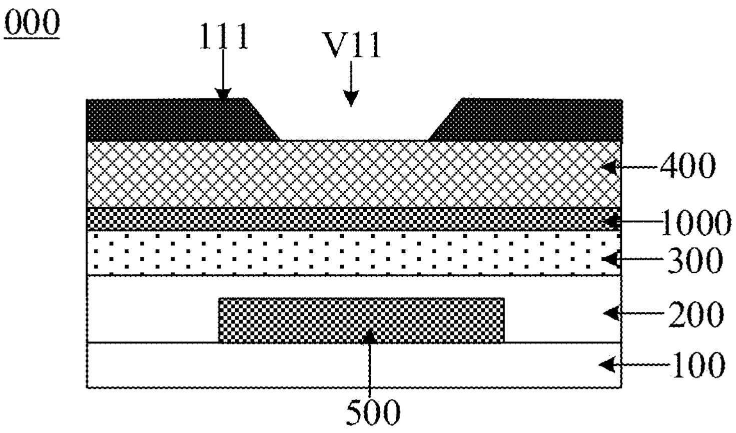
FIG. 20 is a schematic diagram of still another array substrate including a photoresist thin film according to some embodiments of the present disclosure.

For a manner for forming a photoresist pattern on the array substrate 000, referring to FIG. 20, FIG. 20 is a schematic diagram of still another array substrate including a photoresist thin film according to some embodiments of the present disclosure. It should be noted that for the process of forming the second lap joint via V20 shown in FIG. 19 in the present disclosure and the detailed manner of forming the photoresist pattern on the array substrate 000, references may be made to the manner of forming the photoresist pattern on the array substrate 000 in the above embodiments, which are not described in the present disclosure.

Figure 21:
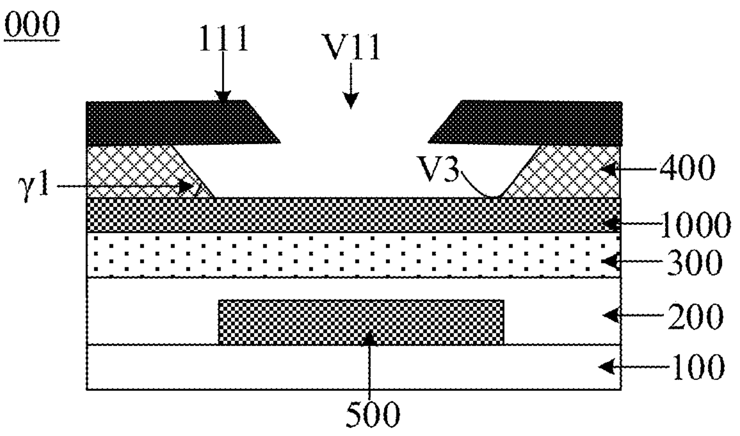
FIG. 21 is a schematic diagram of another array substrate forming a third via according to some embodiments of the present disclosure.

For a manner for forming the third via V3 in the third insulating layer 400, referring to FIG. 21, FIG. 21 is a schematic diagram of still another array substrate forming a third via according to some embodiments of the present disclosure. After the photoresist pattern 111 is formed on the array substrate 000, and the photoresist pattern 111 is baked, a mixed gas of a sulfur hexafluoride gas and an oxygen gas is taken as a first etching gas to etch the third insulating layer 400 on the array substrate 000, such that a third via V3 in communication with the opening hole V11 of the photoresist pattern 111 is formed in the third insulating layer 400. It should be noted that for the process of forming the second lap joint via V20 shown in FIG. 19 in the present disclosure and the detailed manner of forming the third via V3 in the third insulating layer 400, references may be made to the manner of forming the third via V3 in the third insulating layer 400 in the above embodiments, which are not described in the present disclosure.

Figure 22:
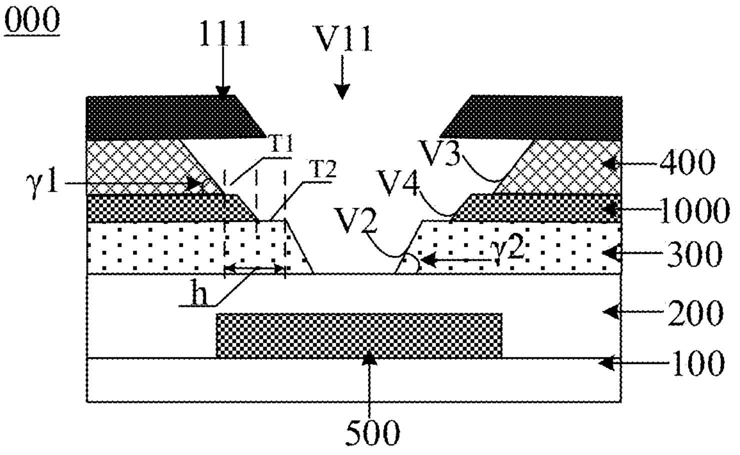
FIG. 22 is a schematic diagram of an array substrate forming a fourth via and a second via according to some embodiments of the present disclosure.

For a manner for forming the fourth via V4 in the fourth insulating layer 1000, referring to FIG. 22, FIG. 22 is a schematic diagram of an array substrate forming a fourth via and a second via according to some embodiments of the present disclosure. After the third via V3 is formed in the third insulating layer 400, the mixed gas of the nitrogen trifluoride gas and the oxygen gas is taken as the second etching gas to etch the fourth insulating layer 1000 in the array substrate 000, such that a fourth via V4 in communication with the third via V3 is formed in the fourth insulating layer 1000. As the rate of etching the fourth insulating layer 1000 formed by the silicon oxide material by the second etching gas is great, and the fourth insulating layer 1000 is formed by a silicon oxide material with a poor film quality, the time for forming the fourth via V4 by etching the fourth insulating layer 1000 is greatly shortened, such that the efficiency of manufacturing the array substrate 000 is further improved.

In addition, as the capability of the second etching gas to laterally etch is poor, the fourth insulating layer 1000 is not inwardly retracted relative to the photoresist pattern 111 in etching the fourth insulating layer 1000 by using the second etching gas. That is, the fourth insulating layer 1000 is not prone to being etched by using the second etching gas in the lateral direction, such that after the fourth via V4 is formed in the fourth insulating layer 1000, the fourth insulating layer 1000 protrudes from the third insulating layer 400, and the part, protruding from the third insulating layer 400, of the second insulating layer 300 is a first step T1. A width of the first step T1 is the distance between the outer boundary of the orthogonal projection of an opening, facing away from the substrate 100, of the fourth via V4 in the fourth insulating layer 1000 on the substrate 100 and the outer boundary of the orthogonal projection of the opening, proximal to the substrate 100, of the third via V3 in the third insulating layer 400 on the substrate 100.

For a manner for forming the second via V2 in the second insulating layer 300, as shown in FIG. 22, after the fourth via V4 is formed in the fourth insulating layer 1000, the mixed gas of the nitrogen trifluoride gas and the oxygen gas is also taken as the second etching gas to etch the second insulating layer 300 in the array substrate 000, such that a second via V2 in communication with the fourth via V4 is formed in the second insulating layer 300. As the rate of etching the second insulating layer 300 formed by the silicon oxide material by using the second etching gas is great, the time for forming the fourth via V4 by etching the fourth insulating layer 1000 is greatly shortened, such that the efficiency of manufacturing the array substrate 000 is improved.

In addition, as the capability of the second etching gas to laterally etch is poor, in etching the second insulating layer 300 by using the second etching gas, the second insulating layer 300 is not inwardly retracted relative to the photoresist pattern 111, that is, the second insulating layer 300 is not prone to being etched by using the second etching gas in the lateral direction, such that after the second via V2 is formed in the second insulating layer 300, the fourth insulating layer 1000 protrudes from the second insulating layer 300, and a part, protruding from the second insulating layer 300, of the fourth insulating layer 1000 is a second step T2. A width of the second step T2 is the distance between the outer boundary of the orthogonal projection of the opening, facing away from the substrate 100, of the second via V2 on the substrate 100 and the outer boundary of the orthogonal projection of the opening, proximal to the substrate 100, of the fourth via V4 on the substrate 100.

In addition, as the density of the silicon oxide of the fourth insulating layer 10000 is less than the density of the silicon oxide of the second insulating layer 300, in etching the fourth insulating layer 1000 and the second insulating layer 300 by using the second etching gas, a rate of inward retraction of the fourth insulating layer 1000 relative to the photoresist pattern 111 is greater than a rate of inward retraction of the second insulating layer 300 relative to the photoresist pattern 111. In this way, the fourth insulating layer 1000 has a guiding effect on a part of a face, proximal to the fourth insulating layer 1000, of the second insulating layer 300, such that a width of the stepped structure formed by the first step T1 and the second step T2 is further increased. A width of the step is the distance h between the outer boundary of the orthogonal projection of the opening, facing away from the substrate 100, of the second via V2 on the substrate 100 and the outer boundary of the orthogonal projection of the opening, proximal to the substrate 100, of the third via V3 on the substrate 100.

Figure 23:
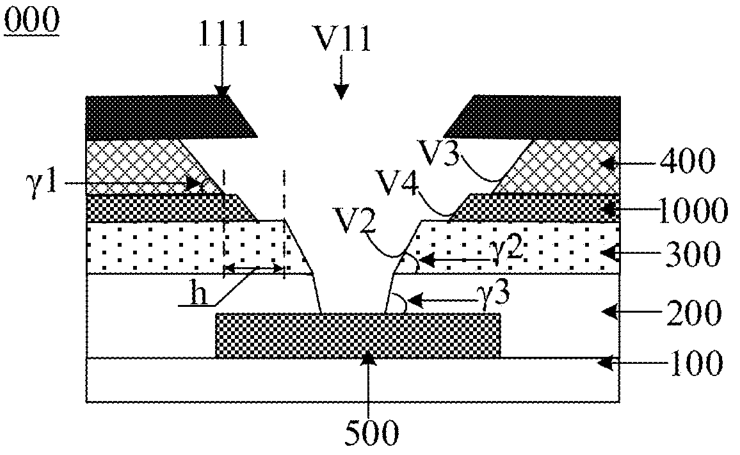
FIG. 23 is a schematic diagram of another array substrate forming a first via according to some embodiments of the present disclosure.

For a manner for forming the first via V1 in the first insulating layer 200, referring to FIG. 23, FIG. 23 is a schematic diagram of still another array substrate forming a first via according to some embodiments of the present disclosure. After the third via V3 is formed in the third insulating layer 400, the mixed gas of the nitrogen trifluoride gas and the oxygen gas is also taken as the second etching gas to etch the first insulating layer 200 in the array substrate 000, such that a first via V1 in communication with the third via V3 is formed in the first insulating layer 200. It should be noted that for the process of forming the second lap joint via V20 shown in FIG. 19 in the present disclosure and the detailed manner of forming the first via V1 in the first insulating layer 200, references may be made to the manner of forming the first via V1 in the first insulating layer 200 in the above embodiments, which are not described in the present disclosure.

Figure 24:
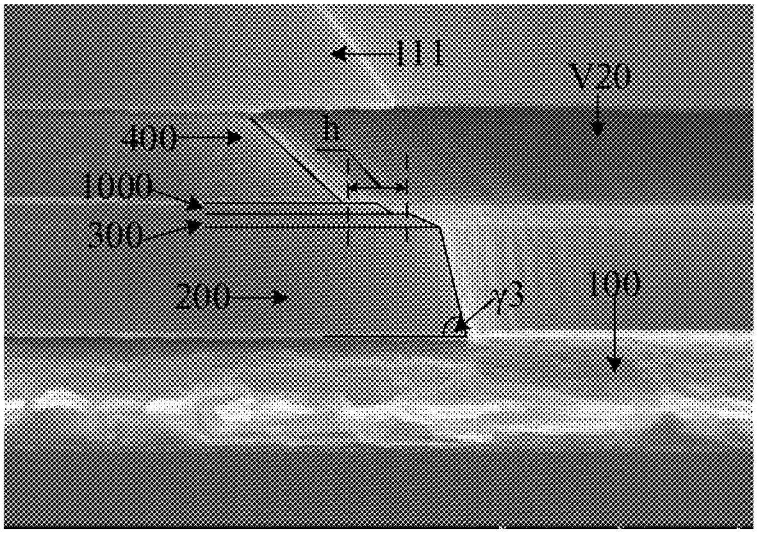
FIG. 24 is a cross-sectional scanning electron microscope image of another second lap joint via formed in an array substrate according to some embodiments of the present disclosure.

In the embodiments of the present disclosure, referring to FIG. 24, FIG. 24 is a practical schematic diagram of a second lap joint via formed in another array substrate according to some embodiments of the present disclosure. As the etching rate of using two etching gases (the first etching gas and the second etching gas) with different etching properties in forming the second lap joint via V20 in the array substrate 000 as shown in FIG. 19 is great compared with the first via formed by long-time etching in the above description, the columnar compound is not present in the second lap joint via V20 in the GOA circuit 002 in the array substrate 000 upon the one patterning process in the embodiments of the present disclosure. In this way, the connecting electrode 600 in the second lap joint via V20 is not prone to poor lap joint, such that the connecting electrode 600 is in great lap joint with the first electrode 500, and the electrical connection effect of different TFTs of the GOA circuit 002 is ensured to be great.

Figure 25:
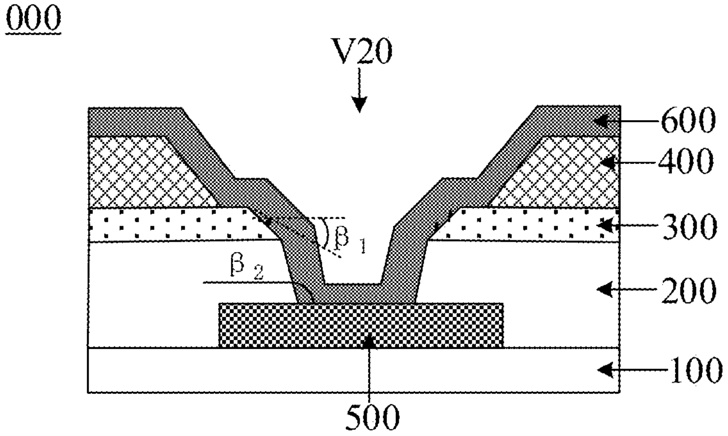
FIG. 25 is an effect diagram of a lap joint of a connecting electrode in a second lap joint via according to some embodiments of the present disclosure.

It should be noted that referring to FIG. 25, FIG. 25 is an effect diagram of a lap joint of a connecting electrode in a second lap joint via according to some embodiments of the present disclosure. At least two communicated vias of at least two insulating layers in the array substrate 000 are configured to form the second lap joint via V20. The sidewall of the second lap joint via V20 is provided with a plurality of columnar compounds thereon. However, a distribution density of the columnar compounds is much less than a distribution density of the columnar compounds in some practices, and an average height of the columnar compounds on the sidewall of the second lap joint via V20 in the present disclosure is less than the thickness of the connecting electrode. In addition, an included angle $\beta_1$ between a tangent line of a top end of the columnar compound protrusion and a horizontal direction is less than a gradient angle $\beta_2$ of the connecting electrode 600.

As such, even if a plurality of columnar compounds are distributed on the sidewall of the second lap joint via V20, the columnar compounds do not affect the lap joint effect of the connecting electrode with the first electrode. The elements in the columnar compound include: carbon, oxygen, fluorine, copper, and the like.

In the embodiments of the present disclosure, as shown in FIG. 6, each of the sub-pixels 001 and the GOA circuits in the array substrate 000 is formed by a laminated film layer structure. Illustratively, the array substrate 000 includes: a substrate 100, and a gate metal layer, a first insulating layer 200, a second insulating layer 300, an active layer, a source-drain metal layer, a fourth insulating layer 1000, an organic insulating layer 1100, a pixel electrode layer, a third insulating layer 400, and a common electrode layer that are disposed on the substrate 100.

The gate metal layer includes: a gate 801 of a driver TFT in the sub-pixel 001, a gate of a TFT in the GOA circuit 002, and the like. Illustratively, the first electrode 400 in the above embodiments is a part of the gate metal layer.

The active layer includes: an active layer 802 of the driver TFT in the sub-pixel 001, an active layer of the TFT in the GOA circuit 002, and the like. The active layer is formed by the oxide semiconductor material.

The source-drain metal layer includes: a source 803 and a drain 804 of the driver TFT in the sub-pixel 001, a source and a drain of the TFT in the GOA circuit 002, and the like.

The pixel electrode layer includes: a pixel electrode 900 electrically connected to the driver TFT in the sub-pixel 001.

The common electrode layer includes: a common electrode 1200 in the sub-pixel 001, a connecting electrode 600 in GOA circuit 002, and the like. That is, the connecting electrode 600 in the non-display region and the common electrode 1200 in the sub-pixel 001 are formed through one patterning process.

In the present disclosure, as the active layer is formed by an oxide semiconductor material, and the oxide semiconductor material is easily affected by ions (e.g., hydrogen ions) in the surrounding film layer, the second insulating layer 300 on a side, proximal to the substrate 100, of the active layer and the fourth insulating layer 1000 on a side, facing away from the substrate 100, of the active layer both need to be formed by a silicon oxide material with greater insulating effect. Other insulating layers (e.g., the first insulating layer 200 and the third insulating layer 400) all are formed by the silicon nitride material.

It should be noted that in order to achieve the electrical connection of the pixel electrode and one of the source and the drain in the driver TFT, the array substrate 000 is punched prior to the pixel electrode being formed, such that a connection via V30 is formed in the display region, and thus the pixel electrode 900 is electrically connected to one of the source and the drain in the driver TFT via the connection via V30. In forming the connection via V30, at least one of the second insulating layer 300, the fourth insulating layer 1000, and the organic insulating layer 1100 that are disposed near the first lap joint via V10 and the second lap joint via V20 in the non-display region **00*b* is removed. Illustratively, in FIG. 6, in forming the connection via V30, the fourth insulating layer 1000 and the organic insulating layer 1100 that are disposed near the first lap joint via V10 and the second lap joint via V20 in the non-display region 00*b* are removed. In FIG. 14, in forming the connection via V30, the second insulating layer 300, the fourth insulating layer 1000, and the organic insulating layer 1100 that are disposed near the first lap joint via V10 and the second lap joint via V20 in the non-display region 00*b* are removed. In FIG. 19, in forming the connection via V30, the organic insulating layer 1100 disposed near the first lap joint via V10 and the second lap joint via V20 in the non-display region 00*b*** is removed.

The embodiments of the present disclosure further provide a method for manufacturing an array substrate. The method for manufacturing the array substrate includes the following processes.

In S1, a first electrode is formed on a substrate.

In S2, at least two insulating layers are formed on the first electrode, and at least two communicated vias are formed in the at least two insulating layers by sequentially performing a first etching treatment and a second etching treatment on the at least two insulating layers, wherein a size of a first via, most proximal to the substrate, in at least two of the vias is less than that other vias.

In S3, a connecting electrode is formed on the at least two insulating layers, such that the connecting electrode is lapped with the first electrode via the at least two vias.

In some embodiments, forming the at least two insulating layers on the first electrode and sequentially performing the first etching treatment and the second etching treatment on the at least two insulating layers include: sequentially forming a first insulating layer, a second insulating layer, and a third insulating layer on the first electrode; forming a third via in the third insulating layer by performing the first etching treatment on the third insulating layer by using a first etching gas; and forming a second via in communication with the third via in the second insulating layer and a first via in communication with the second via in the first insulating layer by sequentially performing the second etching treatment on the second insulating layer and the third insulating layer by using a second etching gas; wherein an orthogonal projection of an opening, facing away from the substrate, of the second via on the substrate is within an orthogonal projection of an opening, proximal to the substrate, of the third via on the substrate, and an outer boundary of the orthogonal projection of the opening, facing away from the substrate, of the second via on the substrate is not overlapped with an outer boundary of the orthogonal projection of the opening, proximal to the substrate, of the third via on the substrate.

In some embodiments, forming the at least two insulating layers on the first electrode and sequentially performing the first etching treatment and the second etching treatment on the at least two insulating layers include: sequentially forming a first insulating layer and a third insulating layer on the first electrode; forming a third via in the third insulating layer by performing the first etching treatment on the third insulating layer by using a first etching gas; and forming a first via in communication with the third via in the first insulating layer by performing the second etching treatment on the first insulating layer by using a second etching gas; wherein an orthogonal projection of an opening, facing away from the substrate, of the first via on the substrate is within an orthogonal projection of an opening, proximal to the substrate, of the third via on the substrate, and an outer boundary of the orthogonal projection of the opening, facing away from the substrate, of the first via on the substrate is not overlapped with an outer boundary of the orthogonal projection of the opening, proximal to the substrate, of the third via on the substrate.

In some embodiments, forming the at least two insulating layers on the first electrode and sequentially performing the first etching treatment and the second etching treatment on the at least two insulating layers include: sequentially forming a first insulating layer, a second insulating layer, a fourth insulating layer, and a third insulating layer on the first electrode; forming a third via in the third insulating layer by performing the first etching treatment on the third insulating layer by using a first etching gas; and forming a fourth via in communication with the third via in the fourth insulating layer, a second via in communication with the fourth via in the second insulating layer, and a first via in communication with the second via in the first insulating layer by sequentially performing the second etching treatment on the fourth insulating layer, the second insulating layer, and the first insulating layer by using a second etching gas;

wherein an orthogonal projection of an opening, facing away from the substrate, of the fourth via on the substrate is within an orthogonal projection of an opening, proximal to the substrate, of the third via on the substrate, and an outer boundary of the orthogonal projection of the opening, facing away from the substrate, of the fourth via on the substrate is not overlapped with an outer boundary of the orthogonal projection of the opening, proximal to the substrate, of the third via on the substrate; and an orthogonal projection of an opening, facing away from the substrate, of the second via on the substrate is within an orthogonal projection of an opening, proximal to the substrate, of the fourth via on the substrate, and an outer boundary of the orthogonal projection of the opening, facing away from the substrate, of the second via on the substrate is not overlapped with an outer boundary of the orthogonal projection of the opening, proximal to the substrate, of the fourth via on the substrate.

In some embodiments, materials of the first insulating layer and the third insulating layer both include silicon and nitrogen, and a material of the second insulating layer includes silicon and oxygen.

In some embodiments, materials of the first insulating layer and the third insulating layer include silicon and nitrogen.

In some embodiments, materials of the first insulating layer and the third insulating layer both include silicon and nitrogen, and materials of the second insulating layer and the fourth insulating layer both include silicon and oxygen.

In some embodiments, a capability of the first etching gas to laterally etch the third insulating layer is greater than a capability of the second etching gas to laterally etch the first insulating layer In some embodiments, the first etching gas is a mixed gas of at least one of a sulfur hexafluoride gas, a sulfur tetrafluoride gas, a carbon tetrafluoride gas, and a nitrogen fluoride gas, and an oxygen gas.

In some embodiments, the second etching gas is a mixed gas of a nitrogen trifluoride gas and an oxygen gas.

It may be clearly understood by those skilled in the art that, for convenience and simplicity of description, the detailed principles of the array substrate described above may refer to the corresponding contents in the above embodiments of the array substrate structure, and thus are not described here again.

The embodiments of the present disclosure further provide a display panel. The display panel includes: an array substrate and a color film substrate that are opposite to each other, and a liquid crystal layer disposed therebetween. The array substrate is the array substrate in the above embodiments. For example, the array substrate is the array substrate shown in FIG. 6. After the color film substrate and the array substrate are connected, the display panel applies an electric signal to the array substrate, such that the display panel displays screens.

The embodiments of the present disclosure further provide a display device. The display device is: any product or component with a display function, such as a mobile phone, a tablet computer, a television, a display, a notebook computer, a digital photo frame, and a navigator. The display device includes: a driver chip and a display panel.

In the embodiments of the present disclosure, the display panel is the display panel in the above embodiments. For example, the display panel includes: the array substrate shown in FIG. 6, FIG. 14, or FIG. 19, the color film substrate opposite to the array substrate, and a liquid crystal layer disposed therebetween. The driver chip is connected to the display panel and configured to provide electric signals for the display panel, such that the display panel displays screens.

It should be noted that in the accompanying drawings, for clarity of the illustration, the dimension of the layers and regions may be scaled up. It should be understood that when an element or layer is described as being "on" another element or layer, the described element or layer may be directly located on other elements or layers, or an intermediate layer may exist. In addition, it should be understood that when an element or layer is described as being "under" another element or layer, the described element or layer may be directly located under other elements, or more than one intermediate layer or element may exist. In addition, it should be further understood that when a layer or element is described as being arranged "between" two layers or elements, the described layer or element may be the only layer between the two layers or elements, or more than one intermediate layer or element may exist. In the whole disclosure, like reference numerals indicate like elements.

In the present disclosure, the terms "first" and "second" are merely used for descriptive purposes and should not be construed as indicating or implying the relative importance. The term "a plurality of" refers to two or more, unless otherwise explicitly defined.

Described above are merely optional embodiments of the present disclosure and are not intended to limit the present disclosure. Any modifications, equivalents, improvements, and the like, made within the spirit and principle of the present disclosure should fall within the protection scope of the present disclosure.

What is claimed is:

1. A method for manufacturing an array substrate, comprising:

forming a first electrode on a substrate;

forming at least two insulating layers on the first electrode, and forming at least two communicated vias in the at least two insulating layers by sequentially performing a first etching treatment and a second etching treatment on the at least two insulating layers, wherein a size of a first via, most proximal to the substrate, in the at least two vias is less than sizes of other vias, and at least two communicated vias in the at least two insulating layers are configured to compose a second lap joint via, wherein a plurality of columnar compounds are provided on a sidewall of the second lap joint via, and an average height of the plurality of columnar compounds is less than a thickness of the connecting electrode; and forming a connecting electrode on the at least two insulating layers, such that the connecting electrode is lapped with the first electrode via the at least two vias.

2. The method according to claim 1, wherein forming the at least two insulating layers on the first electrode and sequentially performing the first etching treatment and the second etching treatment on the at least two insulating layers comprise:

sequentially forming a first insulating layer, a second insulating layer, and a third insulating layer on the first electrode;

forming a third via in the third insulating layer by performing the first etching treatment on the third insulating layer by using a first etching gas; and forming a second via in communication with the third via in the second insulating layer and a first via in communication with the second via in the first insulating layer by sequentially performing the second etching treatment on the second insulating layer and the third insulating layer by using a second etching gas, wherein an orthogonal projection of an opening, facing away from the substrate, of the second via on the substrate is within an orthogonal projection of an opening, proximal to the substrate, of the third via on the substrate, and an outer boundary of the orthogonal projection of the opening, facing away from the substrate, of the second via on the substrate is not overlapped with an outer boundary of the orthogonal projection of the opening, proximal to the substrate, of the third via on the substrate.

3. The method according to claim 1, wherein forming the at least two insulating layers on the first electrode and sequentially performing the first etching treatment and the second etching treatment on the at least two insulating layers comprise:

sequentially forming a first insulating layer and a third insulating layer on the first electrode;

forming a third via in the third insulating layer by performing the first etching treatment on the third insulating layer by using a first etching gas; and forming a first via in communication with the third via in the first insulating layer by performing the second etching treatment on the first insulating layer by using a second etching gas;

wherein an orthogonal projection of an opening, facing away from the substrate, of the first via on the substrate is within an orthogonal projection of an opening, proximal to the substrate, of the third via on the substrate, and an outer boundary of the orthogonal projection of the opening, facing away from the substrate, of the first via on the substrate is not overlapped with an outer boundary of the orthogonal projection of the opening, proximal to the substrate, of the third via on the substrate.

4. The method according to claim 1, wherein forming the at least two insulating layers on the first electrode and sequentially performing the first etching treatment and the second etching treatment on the at least two insulating layers comprise:

sequentially forming a first insulating layer, a second insulating layer, a fourth insulating layer, and a third insulating layer on the first electrode;

forming a third via in the third insulating layer by performing the first etching treatment on the third insulating layer by using a first etching gas; and forming a fourth via in communication with the third via in the fourth insulating layer, a second via in communication with the fourth via in the second insulating layer, and a first via in communication with the second via in the first insulating layer by sequentially performing the second etching treatment on the fourth insulating layer, the second insulating layer, and the first insulating layer by using a second etching gas;

wherein an orthogonal projection of an opening, facing away from the substrate, of the fourth via on the substrate is within an orthogonal projection of an opening, proximal to the substrate, of the third via on the substrate, and an outer boundary of the orthogonal projection of the opening, facing away from the substrate, of the fourth via on the substrate is not overlapped with an outer boundary of the orthogonal projection of the opening, proximal to the substrate, of the third via on the substrate; and an orthogonal projection of an opening, facing away from the substrate, of the second via on the substrate is within an orthogonal projection of an opening, proximal to the substrate, of the fourth via on the substrate, and an outer boundary of the orthogonal projection of the opening, facing away from the substrate, of the second via on the substrate is not overlapped with an outer boundary of the orthogonal projection of the opening, proximal to the substrate, of the fourth via on the substrate.

5. The method according to claim 2, wherein materials of the first insulating layer and the third insulating layer both comprise silicon and nitrogen, and a material of the second insulating layer comprises silicon and oxygen.

6. The method according to claim 3, wherein materials of the first insulating layer and the third insulating layer comprise silicon and nitrogen.

7. The method according to claim 4, wherein materials of the first insulating layer and the third insulating layer both comprise silicon and nitrogen, and materials of the second insulating layer and the fourth insulating layer both comprise silicon and oxygen.

8. The method according to claim 5, wherein a capability of the first etching gas to laterally etch the third insulating layer is greater than a capability of the second etching gas to laterally etch the first insulating layer.

9. An array substrate, comprising:

a substrate, and a first electrode, a connecting electrode, and at least two insulating layers arranged on the substrate, wherein the first electrode is disposed on a side, proximal to the first electrode, of the at least two insulating layers, and the connecting electrode is disposed on a side, facing away from the substrate, of the at least two insulating layers; and at least two communicated vias are arranged in the at least two insulating layers, a size of a first via, most proximal to the substrate, in the at least two vias is less than sizes of other vias, the connecting electrode is lapped with the first electrode via the at least two vias, and at least two communicated vias in the at least two insulating layers are configured to compose a second lap joint via, wherein a plurality of columnar compounds are provided on a sidewall of the second lap joint via, and an average height of the plurality of columnar compounds is less than a thickness of the connecting electrode.

10. The array substrate according to claim 9, wherein the at least two insulating layers comprise: a first insulating layer, a second insulating layer, and a third insulating layer sequentially arranged in a direction perpendicular to and away from the substrate, wherein the first insulating layer is provided with a first via, the second insulating layer is provided with a second via in communication with the first via, and the third insulating layer is provided with a third via in communication with the second via;

wherein an orthogonal projection of an opening, facing away from the substrate, of the second via on the substrate is within an orthogonal projection of an opening, proximal to the substrate, of the third via on the substrate, and an outer boundary of the orthogonal projection of the opening, facing away from the substrate, of the second via on the substrate is not overlapped with an outer boundary of the orthogonal projection of the opening, proximal to the substrate, of the third via on the substrate.

11. The array substrate according to claim 10, wherein an outer boundary of an orthogonal projection of an opening, facing away from the substrate, of the first via on the substrate is overlapped with an outer boundary of an orthogonal projection of an opening, proximal to the substrate, of the second via on the substrate.

12. The array substrate according to claim 10, wherein an included angle between a sidewall of the third via and a face, proximal to the substrate, of the third insulating layer is less than 60°.

13. The array substrate according to claim 12, wherein the included angle between the sidewall of the third via and the face, proximal to the substrate, of the third insulating layer is less than or equal to 45°.

14. The array substrate according to claim 13, wherein a distance between the outer boundary of the orthogonal projection of an opening, facing away from the substrate, of the second via on the substrate and the outer boundary of the orthogonal projection of the opening, proximal to the substrate, of the third via on the substrate ranges from 0.2 micron to 0.5 micron.

15. The array substrate according to claim 14, wherein a thickness of the second insulating layer ranges from 500 angstroms to 1000 angstroms, and an included angle between a sidewall of the second via and a face, proximal to the substrate, of the second insulating layer is greater than or equal to 30° and less than or equal to 50°; or a thickness of the second insulating layer ranges from 200 angstroms to 500 angstroms, and an included angle between a sidewall of the second via and a face, proximal to the substrate, of the second insulating layer is less than or equal to 30°.

16. The array substrate according to claim 9, wherein the at least two insulating layers comprise: a first insulating layer and a third insulating layer sequentially arranged in a direction perpendicular to and away from the substrate, wherein the first insulating layer is provided with a first via, and the third insulating layer is provided with a third via in communication with the first via;

wherein an orthogonal projection of an opening, facing away from the substrate, of the first via on the substrate is within an orthogonal projection of an opening, proximal to the substrate, of the third via on the substrate, and an outer boundary of the orthogonal projection of the opening, facing away from the substrate, of the first via on the substrate is not overlapped with an outer boundary of the orthogonal projection of the opening, proximal to the substrate, of the third via on the substrate; or the at least two insulating layers comprise: a first insulating layer, a second insulating layer, a fourth insulating layer, and a third insulating layer sequentially arranged in a direction perpendicular to and away from the substrate, wherein the first insulating layer is provided with a first via, the second insulating layer is provided with a second via in communication with the first via, the fourth insulating layer is provided with a fourth via in communication with the second via, and the third insulating layer is provided with a third via in communication with the fourth via;

wherein an orthogonal projection of an opening, facing away from the substrate, of the fourth via on the substrate is within an orthogonal projection of an opening, proximal to the substrate, of the third via on the substrate, and an outer boundary of the orthogonal projection of the opening, facing away from the substrate, of the fourth via on the substrate is not overlapped with an outer boundary of the orthogonal projection of the opening, proximal to the substrate, of the third via on the substrate; and an orthogonal projection of an opening, facing away from the substrate, of the second via on the substrate is within an orthogonal projection of an opening, proximal to the substrate, of the fourth via on the substrate, and an outer boundary of the orthogonal projection of the opening, facing away from the substrate, of the second via on the substrate is not overlapped with an outer boundary of the orthogonal projection of the opening, proximal to the substrate of the fourth via on the substrate.

17. The array substrate according to claim 16, wherein a part, proximal to the third insulating layer, of a sidewall of the first via is an arc-shaped sidewall.

18. The array substrate of claim 9, further comprising: a second electrode between two adjacent insulating layers in the at least two insulating layers, the at least two insulating layers are further provided with a first lap joint via, and the connecting electrode is lapped with the second electrode via the first lap joint via.

19. A display panel, comprising: an array substrate and a color film substrate arranged oppositely, wherein the array substrate comprises:

a substrate, and a first electrode, a connecting electrode, and at least two insulating layers arranged on the substrate, wherein the first electrode is disposed on a side, proximal to the first electrode, of the at least two insulating layers, and the connecting electrode is disposed on a side, facing away from the substrate, of the at least two insulating layers; and at least two communicated vias are arranged in the at least two insulating layers, a size of a first via, most proximal to the substrate, in the at least two vias is less than sizes of other vias, the connecting electrode is lapped with the first electrode via the at least two vias, and at least two communicated vias in the at least two insulating layers are configured to compose a second lap joint via, wherein a plurality of columnar compounds are provided on a sidewall of the second lap joint via, and an average height of the plurality of columnar compounds is less than a thickness of the connecting electrode.

* * * * *